(12) United States Patent
Sato et al.

(10) Patent No.: US 6,893,928 B2
(45) Date of Patent: May 17, 2005

(54) SEMICONDUCTOR DEVICE AND METHOD OF MANUFACTURING THE SAME

(75) Inventors: Tsutomu Sato, Yokohama (JP); Ichiro Mizushima, Yokohama (JP); Yoshitaka Tsunashima, Yokohama (JP); Toshihiko Iinuma, Yokohama (JP); Kiyotaka Miyano, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 10/390,046

(22) Filed: Mar. 18, 2003

(65) Prior Publication Data

US 2003/0173617 A1 Sep. 18, 2003

Related U.S. Application Data

(62) Division of application No. 09/296,669, filed on Apr. 22, 1999, now Pat. No. 6,570,217.

(30) Foreign Application Priority Data

Apr. 24, 1998 (JP) ............................................. 10-115310
Apr. 21, 1999 (JP) ............................................. 11-113653

(51) Int. Cl.$^7$ ............................................. H01L 21/336
(52) U.S. Cl. ........................ 438/290; 438/291; 438/305
(58) Field of Search ................................. 257/135, 194, 257/336, 344, 408, 607; 438/305, 290–1

(56) References Cited

U.S. PATENT DOCUMENTS

| | | | |
|---|---|---|---|
| 4,169,000 A | * | 9/1979 | Riseman ...................... 438/422 |
| 5,466,630 A | | 11/1995 | Lur |
| 5,658,811 A | | 8/1997 | Kimura et al. |
| 5,666,000 A | | 9/1997 | Dusablon, Sr. et al. |
| 5,856,225 A | | 1/1999 | Lee et al. |
| 5,929,508 A | | 7/1999 | Delgado et al. |
| 6,005,285 A | | 12/1999 | Gardner et al. |
| 6,074,899 A | | 6/2000 | Voldman |

FOREIGN PATENT DOCUMENTS

| | | |
|---|---|---|
| JP | 60-150644 | 8/1985 |
| JP | 63-278375 | 11/1988 |
| JP | 64-22459 | 1/1989 |
| JP | 01-128442 | 5/1989 |
| JP | 2-280381 | 11/1990 |
| JP | 06-334503 | 2/1994 |
| JP | 6-120490 | 4/1994 |
| JP | 07-122750 | 5/1995 |
| JP | 09-008291 | 1/1997 |
| JP | 09-036354 | 2/1997 |
| JP | 09-321294 | 12/1997 |
| JP | 10-256362 | 9/1998 |

OTHER PUBLICATIONS

S. Matsuda, et al., "Novel Corner Rounding Process for Shallow Trench Isolation Utilizing MSTS (Micro–Structure Transformation of Silicon);" IEDM Tech. Digest; pp. 137–140, 1998.

Extended Abstracts (The 46$^{th}$ Spring Meeting, 1999) The Japan Society of Applied Physics and Related Socieites; T. Sato et al.; 28p–YF–6, p. 812, 1999 "Micro Structure Transformation of Silicon (3)—Transformation Control by the Annealing Pressure".

T. Sato, et al., "Trench Transformation Technology Using Hydrogen Annealing for Realizing Highly Reliable Device Structure with Thin Dielectric Films;" VLSI Tech. Digest, pp. 206–207, 1998.

(Continued)

Primary Examiner—Hoai Pham
Assistant Examiner—Wai-Sing Louie
(74) Attorney, Agent, or Firm—Finnegan, Henderson, Farabow, Garrett & Dunner, L.L.P.

(57) ABSTRACT

To provide a cavity in the portion of the silicon substrate which lies beneath the channel region of the MOS transistor.

4 Claims, 34 Drawing Sheets

OTHER PUBLICATIONS

Extended Abstracts (The 59$^{th}$ Autumn Meeting, 1998) The Japan Society of Applied Physics; T. Sato et al., 16p–YB–15, p. 757, 1998 "Micro Structure Transformation of Silicon: MSTS(1)—Transformation and Application Using Silicon Migration".

Extended Abstracts (The 59$^{th}$ Autumn Meeting, 1998) The Japan Society of Applied Physics; K. Mitsutake et al., 16p–YB–16, p. 757, 1998 "Micro Structure Transformation of Silicon: MSTS(2)—Theoretical Investigation".

* cited by examiner

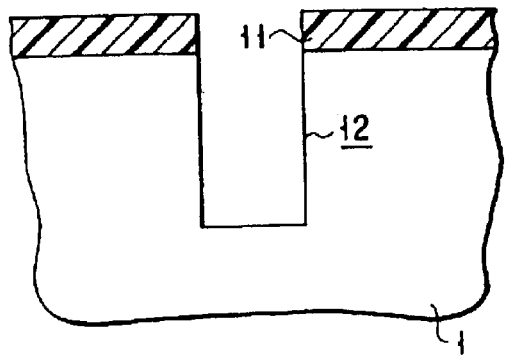
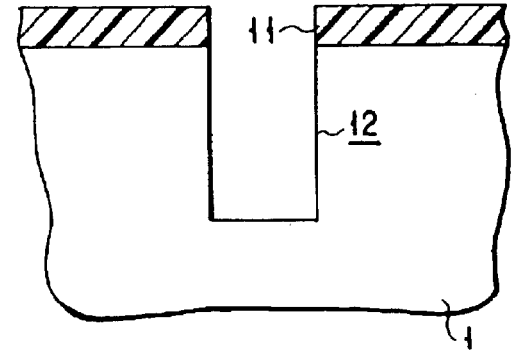
FIG. 2A    FIG. 3A
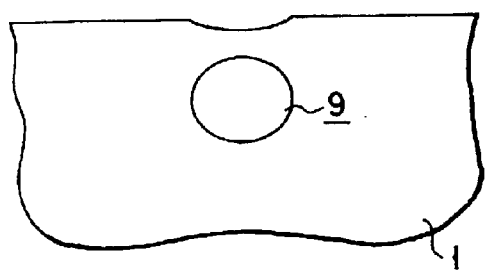
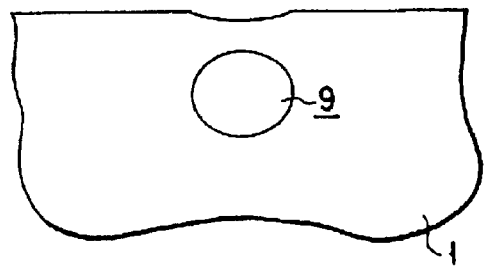
FIG. 2B    FIG. 3B
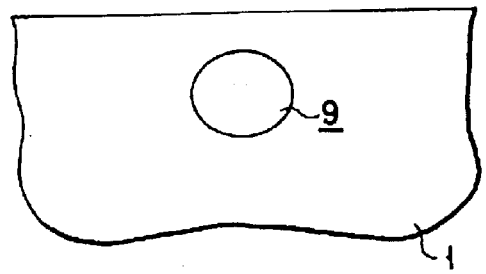
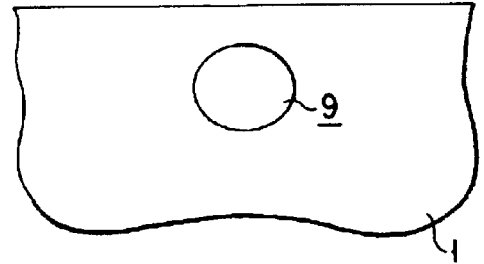
FIG. 2C    FIG. 3C
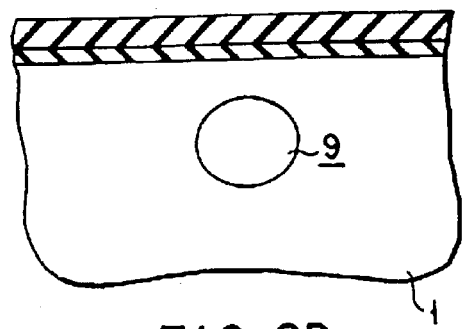
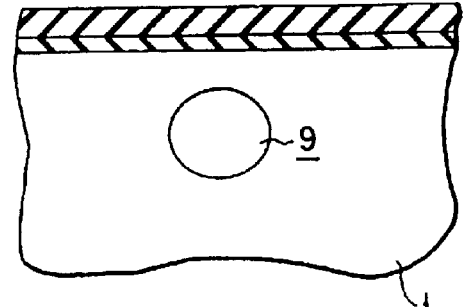
FIG. 2D    FIG. 3D

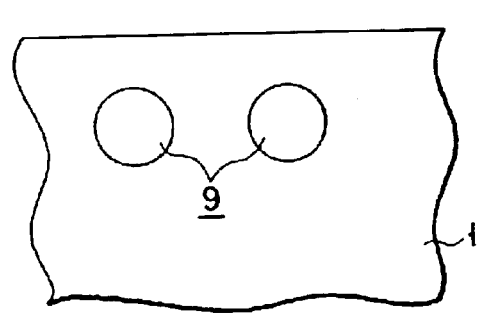 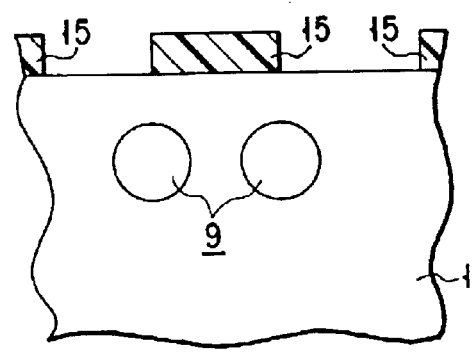
FIG. 9A  FIG. 9B
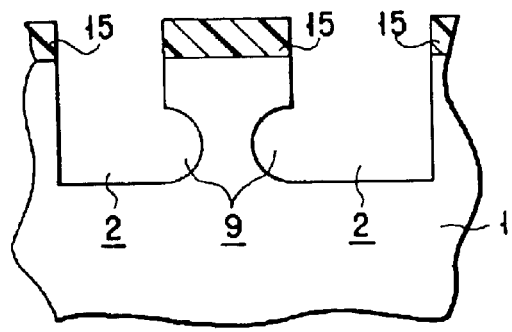
FIG. 9C
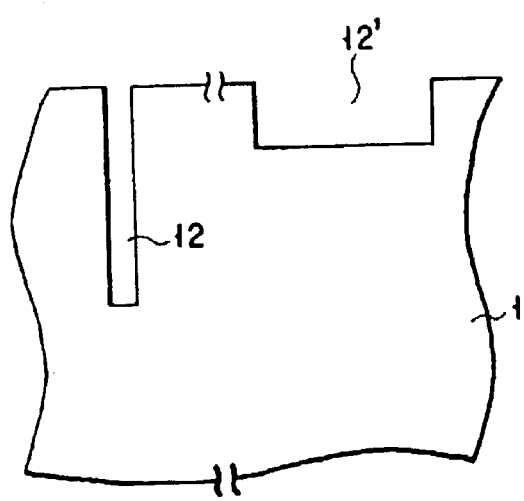 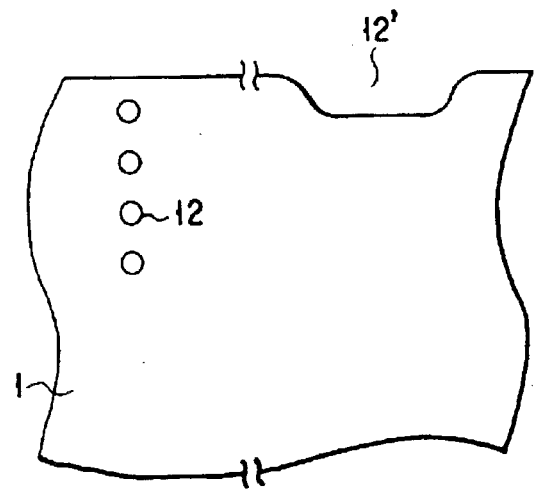
FIG. 10A  FIG. 10B

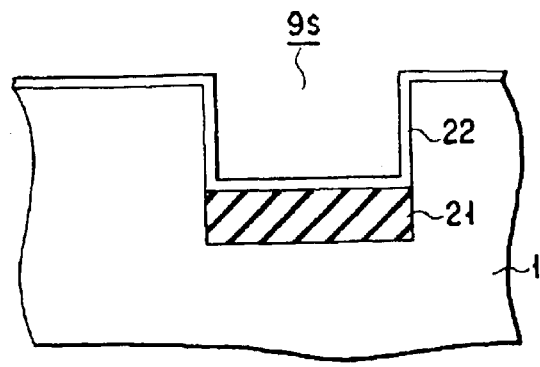
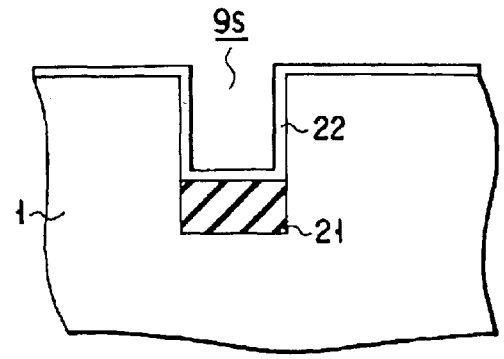
FIG. 15A    FIG. 16A
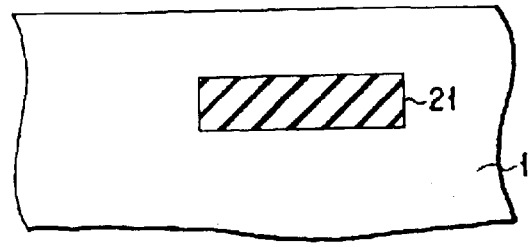
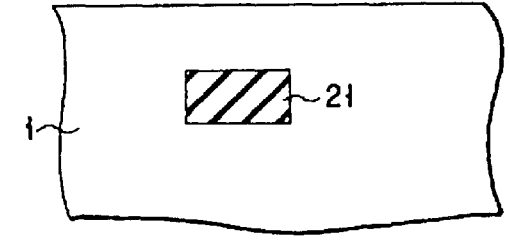
FIG. 15B    FIG. 16B
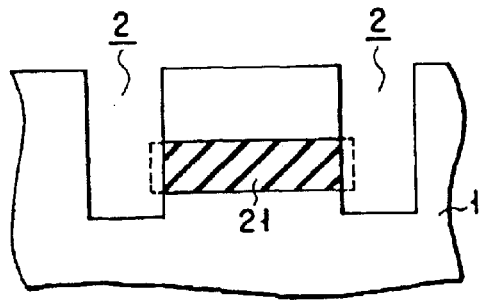
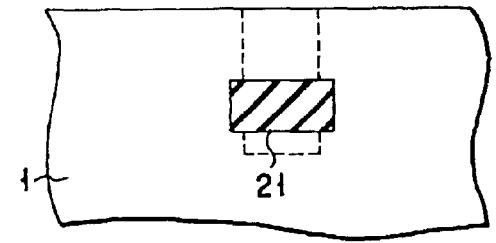
FIG. 15C    FIG. 16C
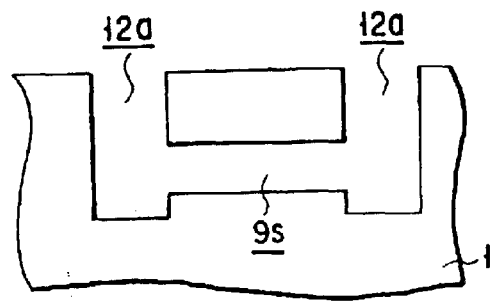
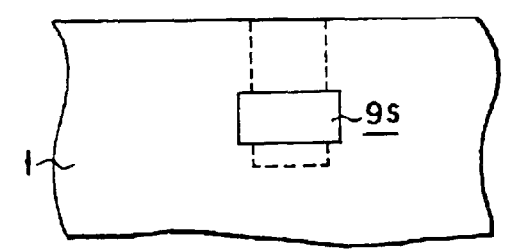
FIG. 15D    FIG. 16D

SEMICONDUCTOR DEVICE AND METHOD OF MANUFACTURING THE SAME

This is a division of application Ser. No. 09/296,669, filed Apr. 22, 1999 now U.S. Pat. No. 6,570,217 which is incorporated herein by reference.

BACKGROUND OF THE INVENTION

The present invention relates to a semiconductor device and a method of manufacturing the semiconductor device and, more particularly, to a semiconductor device in which the short channel effect of a MOS transistor is suppressed and a method of manufacturing the semiconductor device.

Recently, in the important potions of computers or communication equipments, large-scale integrated circuits (LSI) each constituted in such a manner that a large number of transistors, resistors, etc. are connected together so as to constitute an electric circuit and thus integrated on one chip are used in many cases.

Due to this, the performance of an equipment as a whole is deeply connected to the performance of the LSI itself. The enhancement in performance of the LSI itself can be realized by minute-structuring the elements. For example, in case of a MOS transistor, by reducing the size thereof, the increase in speed thereof, the reduction in power consumption thereof, and the enhancement in the degree of integration thereof could so far be realized.

However, various problems are caused as a result of the reduction in size of the elements. For example, the shortening of the channel length achieves the effect of lowering the channel resistance on the one hand but, on the other, gives rise to the problem that a short-channel effect is brought about.

As for the suppression of this short-channel effect, it is already found that it is effective to reduce the junction depth of the source/drain; particularly in case of a low supply voltage, it is effective to form a shallow diffusion layer with a high impurity atom concentration at a position near the gate electrode. In other word, it is effective to replace, in the LDD structure, its shallow diffused layer with a low impurity atom concentration with a diffused layer with a high impurity atom concentration. This diffused layer with a high impurity atom concentration is ordinarily known as an extension layer. Or, by enhancing the impurity atom concentration in the region immediately beneath the channel region (by forming a punch through prevention layer), the effect of suppressing the punch through phenomenon is obtained.

However, in case of any of the above-mentioned methods, there is encountered the difficulty that, as the element size is reduced (as the degree of structural minuteness of the elements is furthered), the formation of a very sharp profile, that is, the formation of a very shallow extension layer with a high impurity atom concentration, the formation of a punch through prevention layer beneath a very shallow channel region, etc. become harder.

Further, as a result of the reduction in size of the elements, the ratios of the various parasitic components become relatively high. For example, the junction capacitance of the source/drain is brought to so high a ratio as to affect the operating speed.

As a countermeasure to the above-mentioned difficulty, there has been tried the method of removing the junction capacitance in such a manner that, using a very thin SOI (Silicon On Insulator) substrate, the bottom surface of the junction is contacted with the buried oxide film.

However, in case of this method, the price of the SOI substrate is high and thus costs high, and besides, since the element operation region lies on the buried oxide film, the carries produced through the element operation are accumulated. That is, a so-called substrate accumulation effect is caused, and thus, there arises the problem that it becomes difficult to operate the elements stably.

Further, there has also been proposed the technical concept that a back gate is formed in the buried oxide film in a very thin SOI substrate, and, to this back gate, a voltage is applied to render the region beneath the channel into a depleted state and thus to prevent a punch through, whereby the short channel effect can be suppressed.

As described above, in order to suppress the short channel effect of the MOS transistor, the introduction of an extension layer or a punch through prevention layer has been proposed, but there arises the other problem that, as the structural minuteness of the elements is furthered, it becomes hard to suppress the short channel effect of the MOS transistor.

BRIEF SUMMARY OF THE INVENTION

The present invention has been made by taking the above-mentioned circumstances into consideration, and it is the object of the invention to provide a semiconductor device in which the short channel effect of the field-effect transistor can be effectively suppressed in spite of furthering the structural minuteness of the elements and also to provide a method of manufacturing the semiconductor device mentioned above.

In order to achieve the above-mentioned object, the semiconductor device according to the present invention comprises a semiconductor substrate, a field-effect transistor formed in a region of the semiconductor substrate wherein the semiconductor substrate has a cavity beneath the region in which the field-effect transistor is formed.

Here, it is pointed out that the inner surface of the cavity should desirably covered with an insulation film. Further, a semiconductor region which is composed of a semiconductor substance different from the semiconductor substance constituting the semiconductor substrate and functions to suppress the spread of the depletion layer beneath the region in which the field-effect transistor forming region is formed may alternatively be formed in place of the above-mentioned cavity.

Further, another semiconductor device according to the present invention comprises a semiconductor substrate, a lateral field-effect transistor formed in a flat portion of the semiconductor substrate, and an insulator formed in the semiconductor substrate beneath the region in which the field-effect transistor is formed.

Here, the cavity, the semiconductor layer or the insulator should desirably be formed in the semiconductor substrate beneath the channel region of the field-effect transistor.

Further, the cavity, the semiconductor layer or the insulator should desirably be formed in the semiconductor substrate beneath the source region and the drain region of the field-effect transistor.

Further, the cavity, the semiconductor layer or the insulator should desirably be formed in the silicon substrate beneath the channel region, the source region and the drain region.

Further, the field-effect transistor is, for example, a MOS transistor or a MESFET.

Further, in case of the cavity or the semiconductor layer, the field-effect transistor may be formed either in a flat portion or in a projected portion of the substrate surface.

Another semiconductor device according to the present invention comprises a field-effect transistor formed in a semiconductor substrate, an electrode formed in the semiconductor substrate beneath the region in which the field-effect transistor is formed, and an insulated gate structure comprised of this electrode and an insulation film formed in the interface between the electrode and the semiconductor substrate.

A method of manufacturing a semiconductor device according to the present invention comprises the steps of forming a groove in the surface of a semiconductor substrate, closing the open portion of the groove by performing a heat treatment under reduced pressure to thereby form a cavity, and forming a field-effect transistor on the region including the cavity.

Here, the above-mentioned heat treatment under reduced pressure should desirably be carried out in a deoxidizing atmosphere. The deoxidizing atmosphere is, for example, a hydrogen atmosphere.

The method of manufacturing a semiconductor device according to the present invention comprises the step of forming a groove in the surface of a semiconductor substrate, the step of filling the interior of the groove to an intermediate depth thereof with an insulator, the step of filling up the remaining portion of the groove with a semiconductor, and the step of forming a lateral field-effect transistor on a region including the insulator.

In the semiconductor device according to the present invention, the spread of the depletion layers from the source and the drain stops at the location where the cavity, the semiconductor layer or the insulator lies, so that the spread of the depletion layer in the channel region can be prevented. Therefore, according to the present invention, even if the structural minuteness of the device is furthered, the short channel effect of the field-effect transistor can be effectively suppressed.

Further, in case the cavity, the semiconductor layer or the insulator is formed in the semiconductor substrate beneath the source region and the drain region of the field-effect transistor, the junction capacitance of the source/drain can be sufficiently reduced without bringing about an increase in the manufacturing costs or the occurrence of a substrate accumulation effect unlike in the case of using a SOI substrate.

Further, in case of still another semiconductor device according to the present invention, there is provided an insulated gate structure constituted of an electrode formed in a semiconductor substrate and an insulation film formed in the interface between this electrode and the semiconductor substrate; and thus, the above-mentioned electrode can be used as a back gate electrode. Therefore, by applying a suitable voltage to the electrode, the spread of the depletion layer in the channel region of the field-effect transistor can be suppressed, so that, even if the structural minuteness of the elements is furthered, the short channel effect can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2L are sectional views parallel to the length directional of the channel showing the respective steps of the method for the manufacture of the MOS transistor shown in FIGS. 1A to 1C.

FIGS. 3A to 3L are sectional view parallel to the width direction of the channel showing the respective steps of the method for the manufacture of the MOS transistor shown in FIGS. 1A to 1C.

FIGS. 9A to 9C are sectional views showing the respective steps of the method of forming the MOS transistor shown in FIGS. 8A to 8C.

FIGS. 10A and 10B are sectional views for explaining the method of performing the positional registration of the cavity.

FIGS. 15A to 15D are sectional views parallel to the length directional of the channel showing the respective steps of the MOS transistor according to a third embodiment of the present invention.

FIGS. 16A to 16D are sectional views parallel to the width directional of the channel showing the respective steps of the MOS transistor according to a third embodiment of the present invention.

DETAILED DESCRIPTION OF THE INVENTION

Figure 1A:
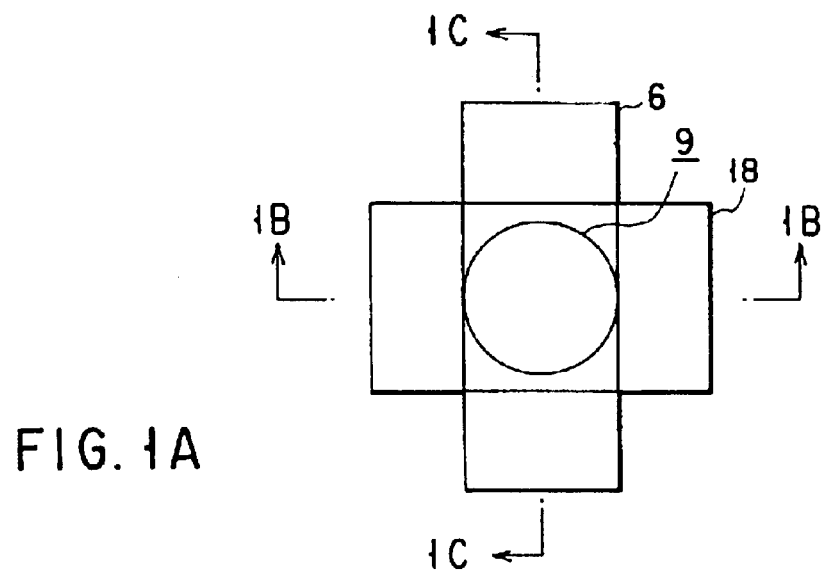
FIGS. 1A to 1C are a plan view and sectional views showing the MOS transistor according to a first embodiment of the present invention.

Embodiments of the present invention will now described, referring to the drawings.

(First Embodiment)

Figure 1B:
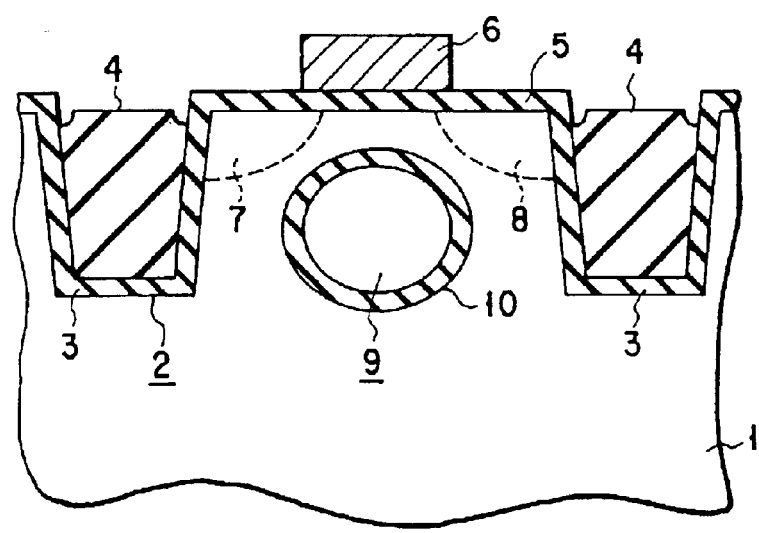
Figure 1C:
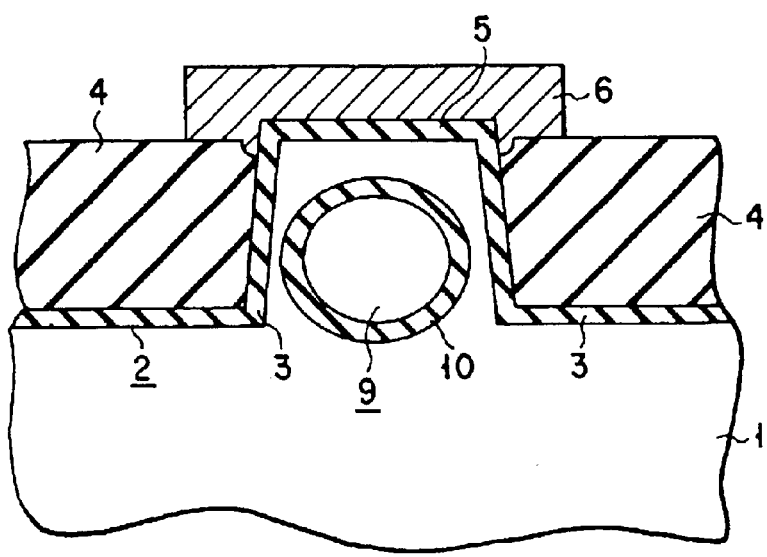

FIGS. 1A to 1C show a plan view and sectional views of the MOS transistor according to a first embodiment of the present invention. FIG. 1A is a plan view of the MOS transistor, and FIG. 1B is a sectional view parallel to the length directional of the channel and FIG. 1C is a sectional view parallel to the width direction of the channel.

Referring to FIGS. 1A to 1C, the reference numeral 1 denotes a silicon substrate. Formed in the surface of this silicon substrate 1 is a shallow element isolation groove 2 for element isolation (STI). The interior of this element isolation groove 2 is filled up with a silicon oxide film 4 through a thermal oxide film 3.

On the portion of the silicon substrate 1 in which a MOS transistor forming region 18 defined by the element isolation groove 2 lies, a gate electrode 6 is formed through a gate insulation film 5. The gate electrode 6 is formed of, e.g., a polycrystalline silicon film. Further, at both sides of the gate electrode 6, a diffused source layer 7 and a diffused drain layer 8 are formed, respectively.

Formed within the silicon substrate 1 beneath the channel region of the MOS transistor and beneath the diffused source layer 7 and the diffused drain layer 8 is a cavity 9, the inner surface of which is covered with a thermal oxide film 10.

According to this embodiment, the spread of the depletion layers from the diffused source layer 7 and the diffused drain layer 8 stop at the cavity 9, so that the spread of the depletion layers in the channel region can be prevented. Therefore, according to this embodiment, even if the structural minuteness of the MOS transistor is furthered, the short channel effect can be effectively suppressed.

Further, according to this embodiment, the cavity 9 is formed beneath a part of the diffused source layer 7 and the diffused drain layer 8, so that the junction capacitance can be sufficiently reduced. Here, it is pointed out that, in case of this embodiment, the MOS transistor is merely partially insulated from the silicon substrate by the cavity 9 unlike in the case of using an SOI substrate, and therefore, there is not caused the substrate accumulation effect that the carriers produced by the element operation be accumulated. Thus, a stable element operation is assured. Further, an expensive SOI substrate need not be used, so that there is naturally no problem concerning the increase in the manufacturing costs.

Next, the method of forming the MOS transistor according to this embodiment will be described. FIGS. 2A to 2L and FIGS. 3A to 3L are sectional views showing the respective steps of the forming method. FIGS. 2A to 2L correspond to the sectional view of FIG. 1B, and FIGS. 3A to 3L correspond to the sectional view of FIG. 1C.

First, as shown in FIG. 2A and FIG. 3A, a photoresist pattern 11 is formed on a silicon substrate 1, and, using this photoresist pattern 11 as a mask, the silicon substrate 1 is subjected to anisotropic etching, for example subjected to patterning by RIE, to form a groove 12. After this, the photoresist pattern 11 is carbonized and scaled off.

Next, as shown in FIG. 2B and FIG. 3B, the whole is subjected to a high-temperature annealing in a deoxidizing atmosphere under reduced pressure such as, e.g., in a 100% hydrogen atmosphere at 10 Torr and at 1000° C., whereby the open portion of the groove 12 is closed to form a cavity 9.

Next, an amorphous silicon film (not shown) with a thickness of 100 nm is formed over the whole surface, and thereafter, the whole is subjected to a high-temperature heat treatment at a temperature higher than 1100° C. at a reduced pressure such as, e.g., 10 Torr. This amorphous silicon film is provided to allow the easy flattening of the substrate surface; and thus, its thickness is sufficient to be of such a value as to allow an easy solid phase growth.

Even if the amorphous silicon film is not provided, the flattening of the substrate surface can be made, but, by previously depositing an amorphous silicon film with such a thickness as to allow crystallization, the flattening of the substrate surface can be finished in a short time.

However, in the case of flattening the substrate surface without using an amorphous silicon film, the flattening is effected by the migration of the silicon (the re-structuring of the silicon) in the substrate surface, so that the crystallizability of the substrate surface can be improved as compared with the case where an amorphous film is used, that is, the case of flattening by solid phase growth.

By the above-mentioned heat treatment, an amorphous silicon film epitaxially grows by solid phase growth from the substrate side to form a monocrystalline silicon film, which is integrated with the silicon substrate 1. The active silicon atoms in the substrate surface migrate by surface diffusion in such a manner that the substrate surface becomes flat as shown in FIG. 2C and FIG. 3C. By this migration, that is, by the re-structuring of the silicon in the substrate surface, the crystallizability of the substrate surface is further improved. Further, pointed out as a different method of flattening the substrate surface is, for example, the method according to which, using the CMP method, the surface of the silicon substrate 1 shown in FIG. 2B is polished to flatten it.

Next, as shown in FIG. 2D and FIG. 3D, the surface of the silicon substrate 1 is thermally oxidized to form a thermal oxide film 13, and then, by the use of the CVD method, a silicon nitride film 14 is formed on the thermal oxide film 13.

Figure 2E:
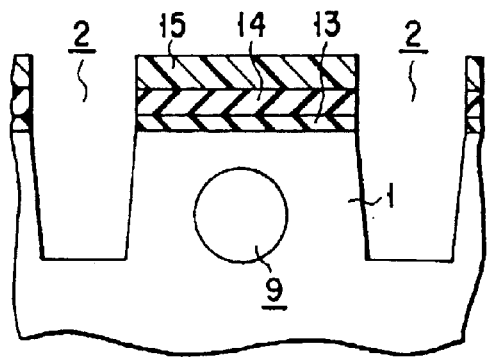
Figure 3E:
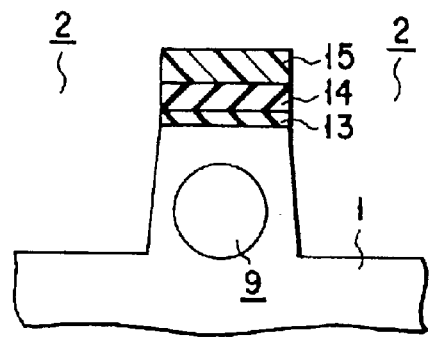

Next, as shown in FIG. 2E and FIG. 3E, a photoresist pattern 15 is formed on the silicon nitride film 14, and thereafter, using this photoresist pattern 15 as mask, the silicon nitride film 14, the thermal oxide film 13 and the silicon substrate 1 are subjected to anisotropic etching such as e.g., patterning by the use of RIE, whereby the element isolation groove 2 is formed. After this, the photoresist pattern 15 is carbonized and scaled off.

Figure 2F:
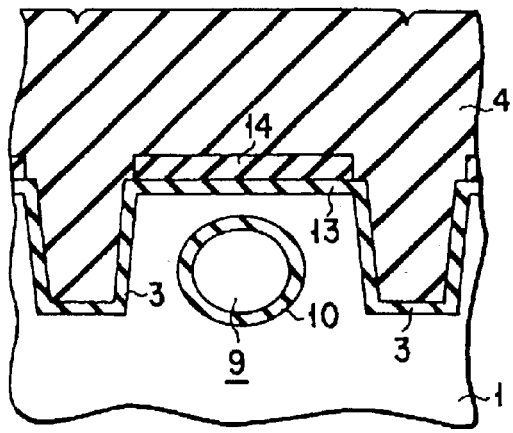
Figure 3F:
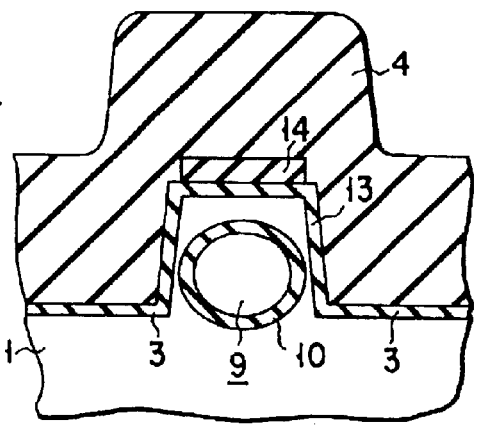

Next, the exposed surface of the element isolation groove 2 is thermally oxidized in a dry oxidizing atmosphere at 950° C. for 30 minutes to form the thermal oxide film 3 as shown in FIG. 2F and FIG. 3F. In this case, the inner surface of the cavity 9 is also oxidized, so that the thermal oxide film 10 is formed on the inner surface of the cavity 9. By forming this thermal oxide film 10, the spread of the depletion layers from the diffused source layer 7 and diffused drain layer 8 is effectively suppressed. Thus, it can surely prevent the occurrence of the inconvenience that these depletion layers join to each other.

After this, by the use of the CVD method, a silicon oxide film 4 is deposited over the whole surface to fill up the element isolation groove 2.

Figure 2G:
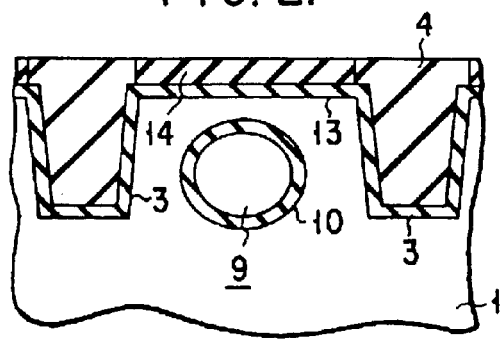
Figure 3G:
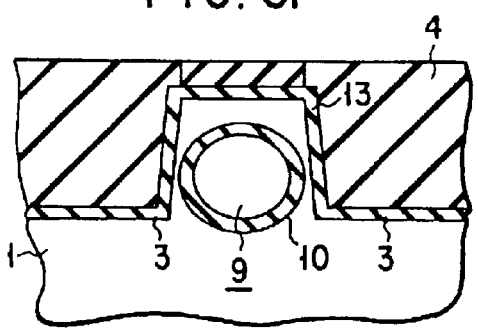

Next, by the use of the CMP method, the silicon oxide film 4 is polished till the surface of the silicon nitride film 13 is exposed as shown in FIG. 2G. and FIG. 3G.

Figure 2H:
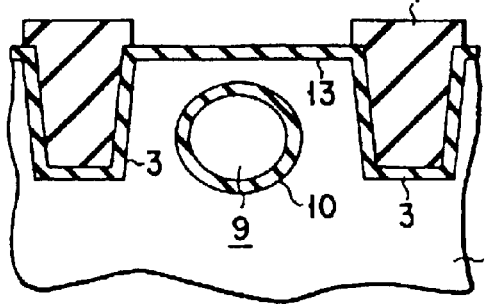
Figure 3H:
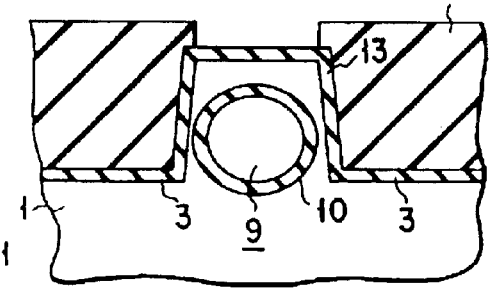

Next, by the use of the a hot $H_3PO_4$ solution, the silicon nitride film 14 is selectively removed as shown in FIG. 2H.

Figure 2I:
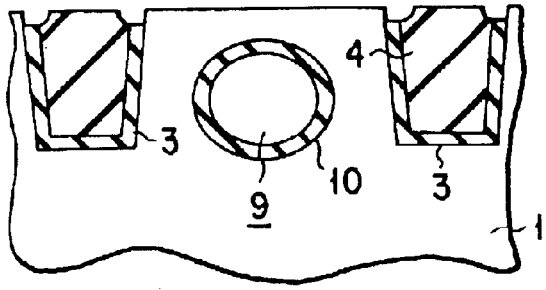
Figure 3I:
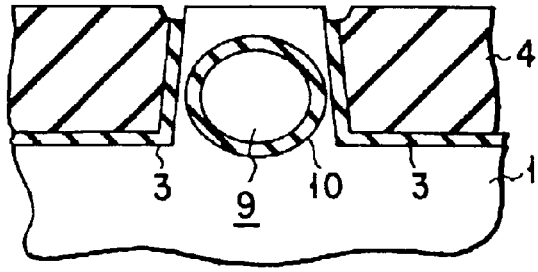

Next, by the use of a dilute HF solution, the thermal oxide film 13 and the portion of the silicon oxide film 4 which exits outside the element isolation groove 2 are removed as shown in FIG. 2I and FIG. 3I. In this case, the thermal oxide film 3 is somewhat removed in the upper edge portion of the element isolation groove 2, as a result of which the surface portion of the silicon substrate 1 lying in the upper edge portion of the element isolation groove 2 is exposed.

Figure 2J:
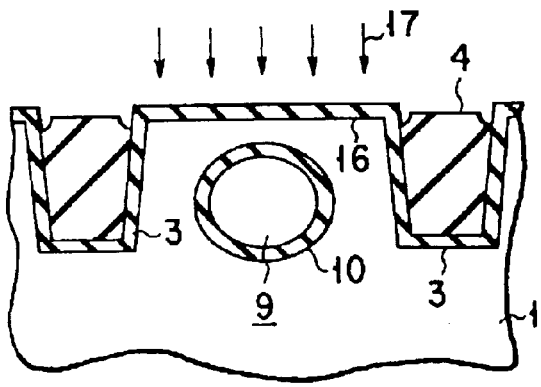
Figure 3J:
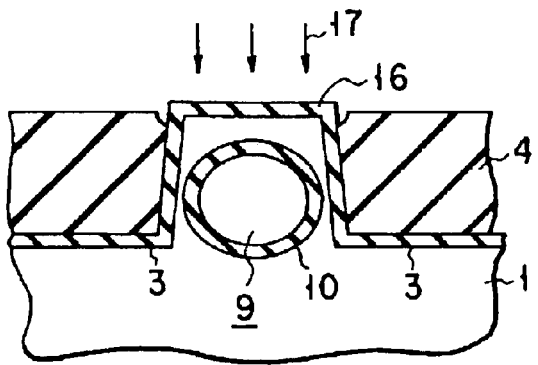
Figure 2K:
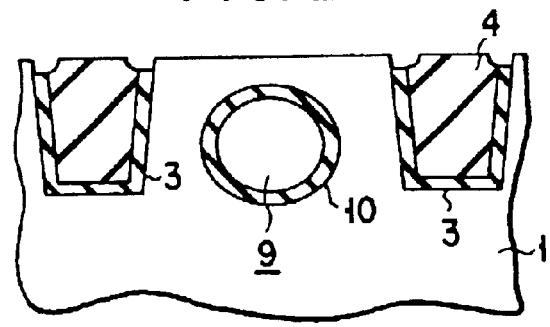
Figure 3K:
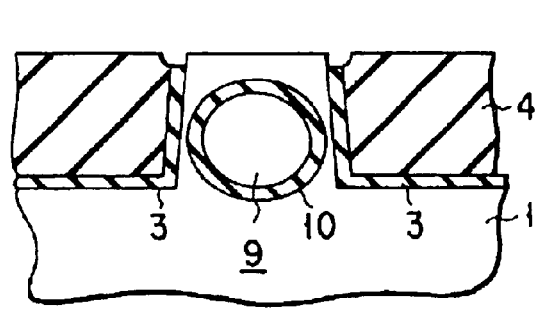

Next, as shown in FIG. 2J and FIG. 3J, the thus exposed surface portion of the silicon substrate 1 is thermally oxidized to form a thermal oxide film 16 with a thickness of, e.g., 20 nm. Thereafter, in order to adjust the threshold voltage, impurity ions 17 are implanted into the surface portion of the silicon substrate 1 through the thermal oxide film 16. After this, the thermal oxide film 16 is removed as shown in FIG. 2K and FIG. 3K.

Figure 2L:
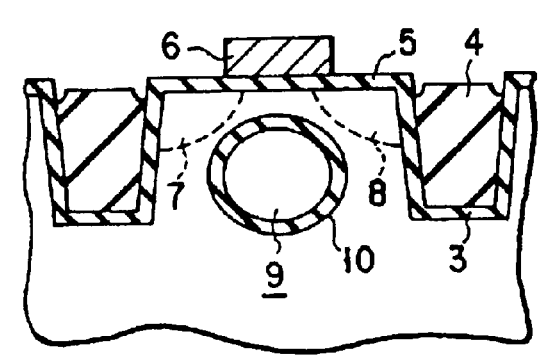
Figure 3L:
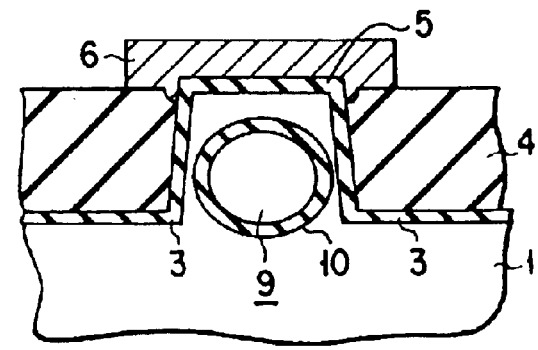

Next, by exposing the silicon substrate 1 in, e.g., an Hcl atmosphere at 900° C., the gate insulation film 5 is formed as shown in FIG. 2L and FIG. 3L. In this case, the gate insulation film 5 is formed not only on the MOS transistor forming region but also on the upper edge portion of the element isolation groove 2. As a result, in the element isolation groove 2, no exposed silicon surface portion comes to exist.

Next, after a polycrystalline silicon film for instance which will constitute the gate electrode 6 is formed over the whole surface, this polycrystalline silicon film is patterned to form the gate electrode 6 as shown in FIG. 2L and FIG. 3L. Here, a polycrystalline silicon gate electrode is formed, but a gate electrode of other structure such as a polymetal gate electrode or a metal gate electrode may alternatively be formed instead.

Finally, as shown in FIG. 2L and FIG. 3L, by the use of the gate electrode 6 as a mask, impurity ions are implanted into the surface of the silicon substrate 1, and thereafter, annealing is performed, whereby the diffused source layer 7 and the diffused drain layer 8 are self-formed in a self-aligning manner, thus completing the MOS transistor.

Figure 4A:
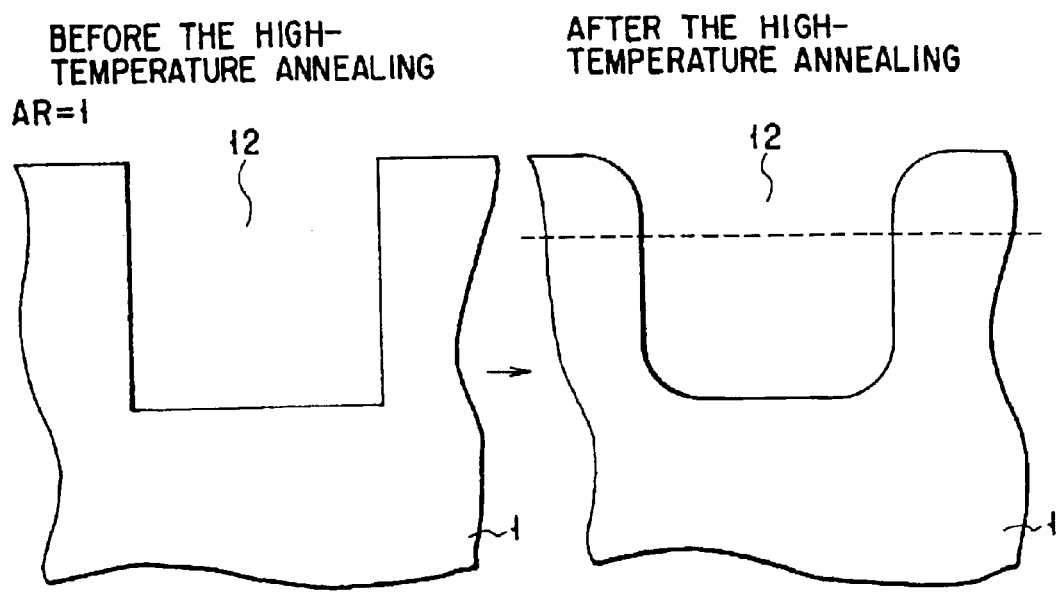
FIGS. 4A to 4C are sectional views showing the difference in the formation of the cavity due to the difference in the aspect ratio of the groove.

Next, the method of forming the cavity 9 by performing a high-temperature annealing under reduced pressure will be described in more detail. FIGS. 3A to 3C are sectional views showing the difference between the resulting cavities caused by the use of different aspect ratios pertaining to the groove. More concretely, these sectional views show the results obtained by performing heat treatment (high-temperature annealing) in a hydrogen atmosphere at a temperature of 1000° C. and under a pressure of 10 Torr (under reduced pressure) for 10 minutes with respect to grooves 12 which have different aspect ratios. FIG. 4A shows the result obtained in case AR=1, FIG. 4B shows the result obtained in case AR=5, and FIG. 4C shows the result obtained in case AR=10.

From FIG. 4A, it is understood that the cavity 9 cannot be formed in case the aspect ratio is small.

Figure 4B:
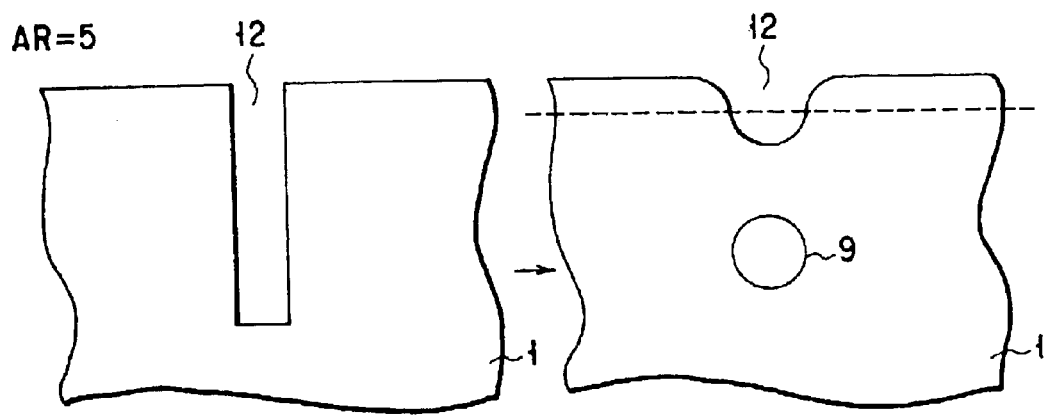

Further, from FIG. 4B, it is understood that, in case the aspect ratio is 5 or greater, the cavity 9 can be formed in a nearly round shape and in a state separated from the bottom of the groove 12.

Figure 4C:
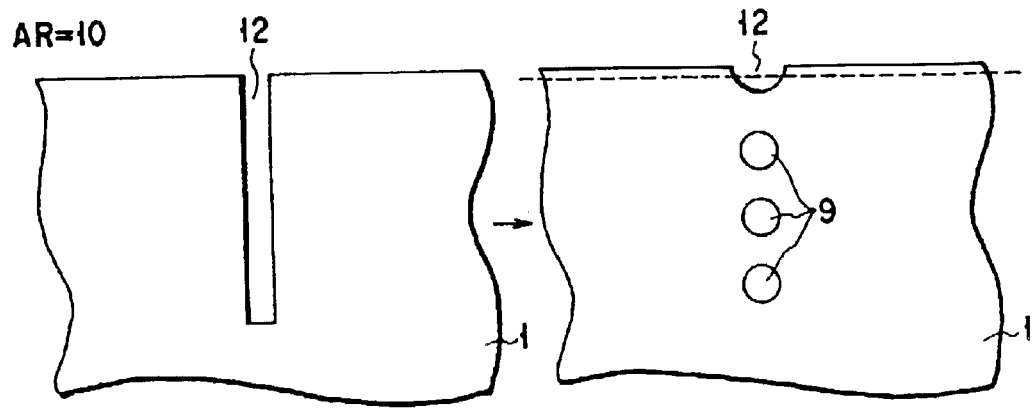

Further, from FIG. 4C, it is understood that, in case the aspect ratio is further increased, a plurality of nearly round cavities 9 can be formed at equal intervals successively from the bottom of the groove 12.

From these results, it can be understood that, in order to form the cavity 9, the groove 12 must be formed with an aspect ratio higher than a certain value. In this connection, it is added that, in case the high-temperature annealing is continuously performed, the substrate surface is finally flattened as shown by a broken line in FIG. 4C.

Figure 5A:
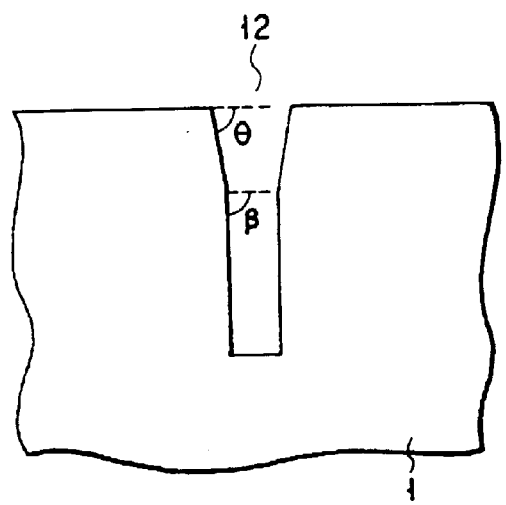
FIGS. 5A to 5D are sectional views for explaining the method of controlling the shape and size of the cavity.
Figure 5C:
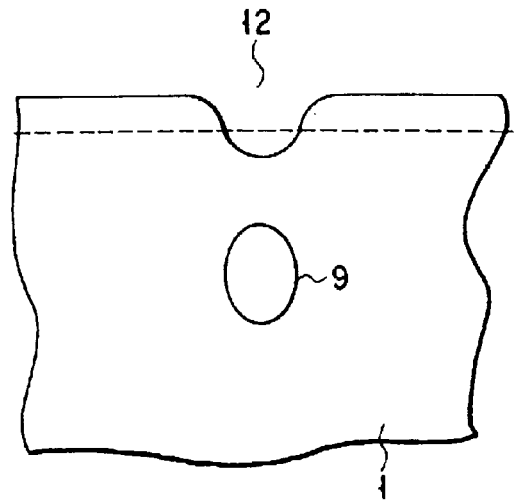
Figure 5B:
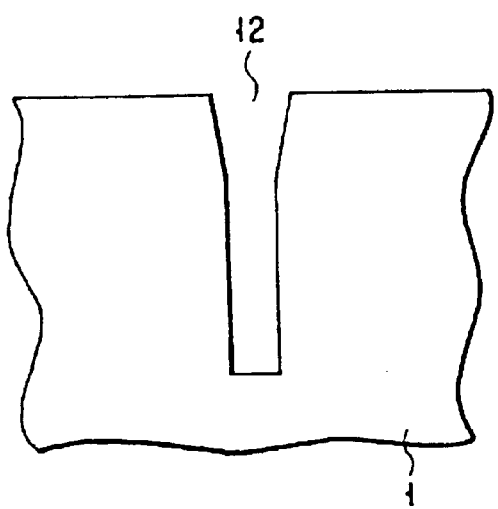
Figure 5D:
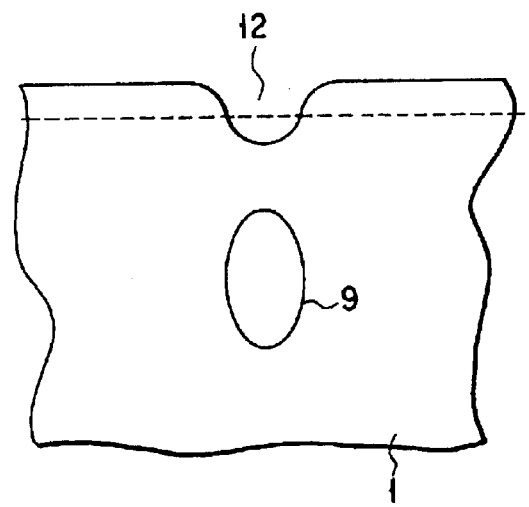

Further, FIGS. 5A to 5B show sectional views for explaining the method of controlling the shape and size of the cavity. In case the groove 12 is formed by changing the upper and lower taper angles θ and β into (θ>β) as shown in FIGS. 5A and 5B, the position at which the taper angle differs can become a clue for forming the cavity 9, so that the shape and size of the cavity 9 can be controlled as shown in FIGS. 5C and 5D. The groove 12 of such a shape can be realized in such a manner that a groove with a tapered side wall is formed by the use of, e.g., the RIE method, and subsequently the groove forming condition is changed to form a groove with a vertical side wall by the use of the RIE method.

In the case shown in FIGS. 5A to 5D, the shape and size of the cavity 9 are controlled by maintaining invariable the depth of that portion of the groove 12 which has a taper angle θ but by changing the depth of that portion of the groove 12 which has the taper angle β. However, the groove forming manner can alternatively be reversed.

Figure 6A:
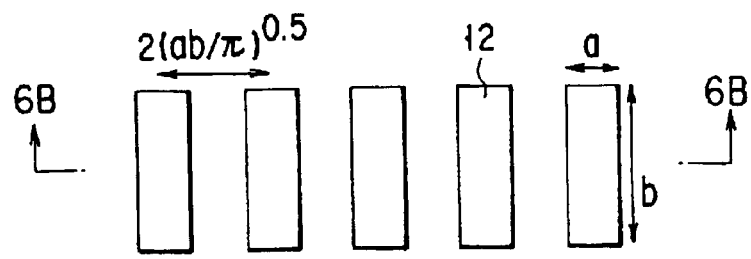
FIGS. 6A to 6D are plan views and sectional views for explaining the method of forming a rod-shaped cavity.
Figure 6B:
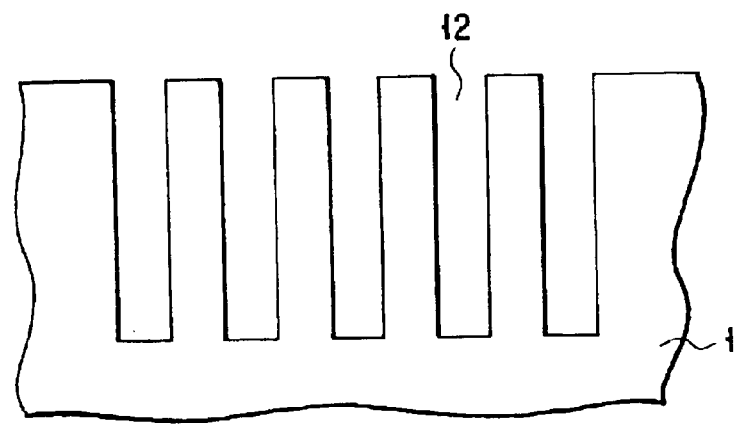
Figure 6C:
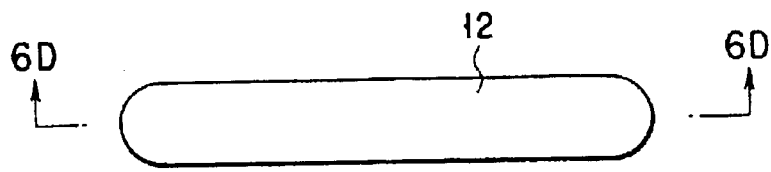

Further, as shown in FIG. 6A which is a plan view and in FIG. 6B which is a sectional view taken along the line A–A' in FIG. 6A, grooves 12 are formed in a state arranged at intervals of $2(ab/\pi)^{0.5}$ or below; the grooves 12 each have a rectangular pattern (having short sides a and long shies b) when seen from above the silicon substrate 1. After these grooves 12 are formed in the above-mentioned arrangement, the whole body is annealed at a high temperature, whereby a rod-shaped cavity 9 can be formed as shown in FIG. 6C which is a plan view and in FIG. 6D which is a sectional view taken along the line A–A' in FIG. 5C.

When a high-temperature annealing is being carried out at a high temperature (such as, e.g., 1100° C.) under reduced pressure (such as, e.g., 10 Torr), the groove 12 changes into a round shape due to the migration of the silicon atoms in the vicinity of the surface of the silicon substrate 1, maintaining its sectional area constant. Accordingly, by forming and arranging the grooves 12 at intervals smaller than the diameter, $2(ab/\pi)^{0.5}$ of the circle which is the final form of the grooves 12 as described above, the mutually adjacent grooves 12 are rendered into one integral form by the high-temperature annealing.

By the use of this rod-shaped cavity 9, a plurality of MOS transistor forming regions 18 are arranged side by side as shown in FIG. 6A which is a plan view, whereby one cavity 9 can be used commonly for the plurality of MOS transistors. FIGS. 7B and 7C respectively show sectional views parallel to the length directional of the channel and parallel to the width directional of the channel of the MOS transistor shown in FIG. 7A.

Figure 8A:
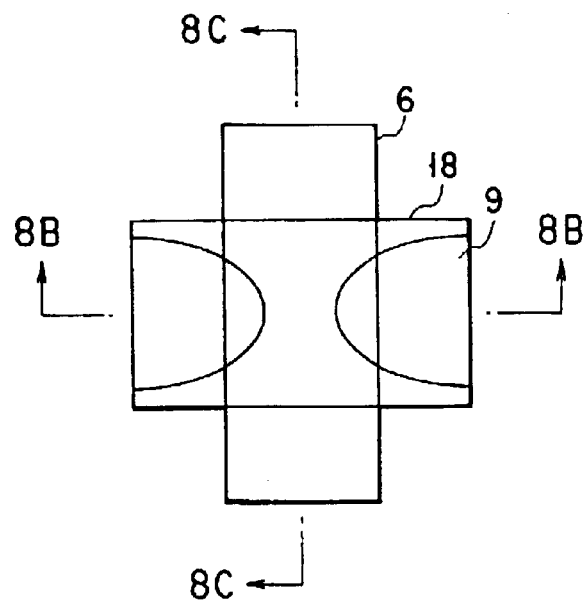
FIGS. 8A to 8C are a plan view and sectional views showing a modification of the MOS transistor shown in FIGS. 1A to 1C.
Figure 8B:
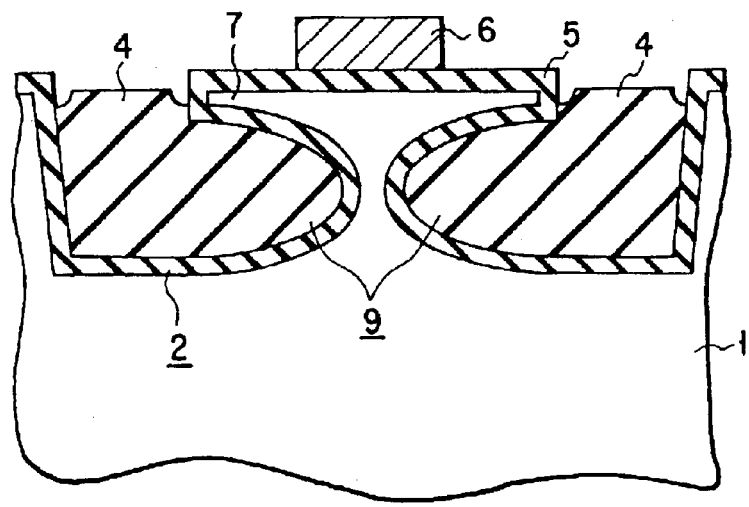
Figure 8C:
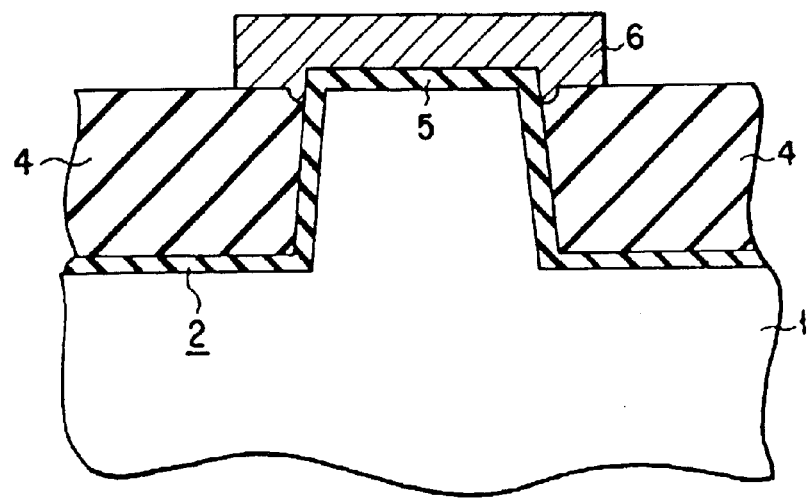

Further, by forming the cavity 9 immediately beneath the diffused source layer 7 and the diffused drain layer 8 as shown in FIGS. 8A to 8C, the junction capacitance of the source/drain can be markedly reduced. In order to obtain such a structure, first two cavities 9 are formed as shown in FIG. 9A; subsequently, a resist pattern 15 is formed as shown in FIG. 9B; and then, as shown in FIG. 9C, by the use of this resist pattern 15 as a mask, an element isolation groove 2 connected to the cavities 9, in other words, the element isolation groove 2 rendered integral with the cavities 9, is formed. After this, the steps shown in FIG. 2F and FIG. 3F, and the following, are followed.

As described above, the shape (See FIGS. 1A to 1C, FIGS. 5A to 5D, and FIGS. 6A to 6D) and the forming position (See FIGS. 1A to 1C, FIGS. 7A to 7C and FIGS. 8A to 8C) of the cavity 9 are arbitrarily determined. Further, the number or size of cavities 9 is also arbitrarily determined. The important thing with the cavity 9 is that the open portion of the groove with a high aspect ratio is closed by performing a high-temperature annealing to change the groove into a cavity.

Next, the method of positionally registering the cavity will be described by the use of the sectional views shown in FIGS. 10A and 10B.

First, when the groove 12 is formed as shown in FIG. 10A, an element isolation groove 12' which is larger in diameter than the that of the element isolation groove 12 but smaller in depth is formed outside the MOS transistor forming region as shown in FIG. 10A. By so doing, as shown in FIG. 10B, the surface of the region in which the groove 12' is formed is not flattened by the step of flattening the surface of the region in which the groove 12 is formed; and thus, the groove 12' remains in the form of a depression. Therefore, by the use of this depression as an registration mark, it becomes possible to easily form the element isolation groove 2 which defines the MOS transistor forming region including the cavity 9.

FIGS. 11A to 11D show schematic diagrams explaining the another positional registration method for the cavity 9.

Figure 11A:
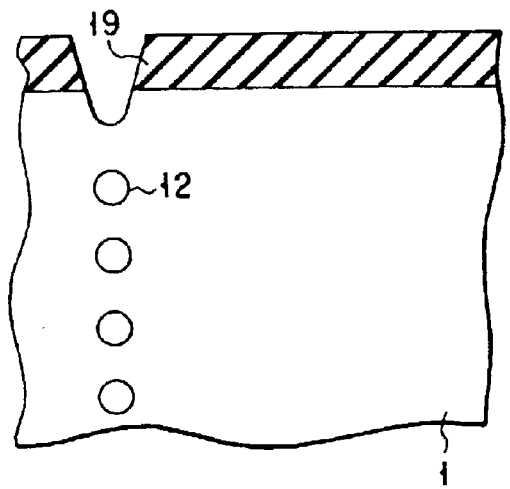
FIGS. 11A to 11D are sectional views for explaining a further method for the positional registration of the cavity.
Figure 11B:
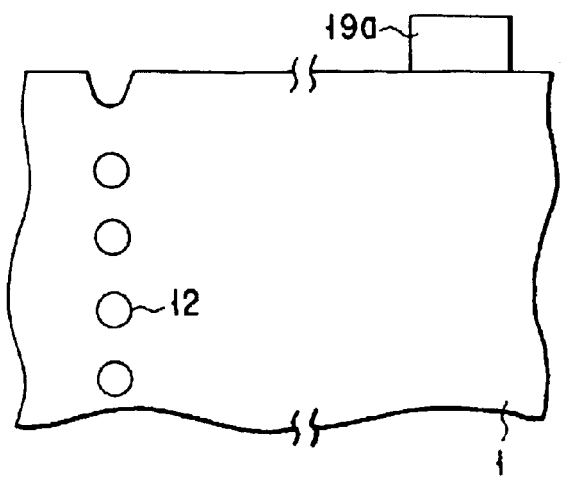

In this case, an insulation film marks 19 is used in place of the photoresist pattern 11 at the processing step shown in FIG. 2A and FIG. 3A thereby form the groove 12. After the cavity 9 is formed by performing a high-temperature annealing (See FIG. 11A), the insulation mask 19 on the silicon substrate 1 is subjected to patterning, whereby a mark 19a composed of an insulator is formed outside the MOS transistor forming region as shown in FIG. 11B.

Figure 11C:
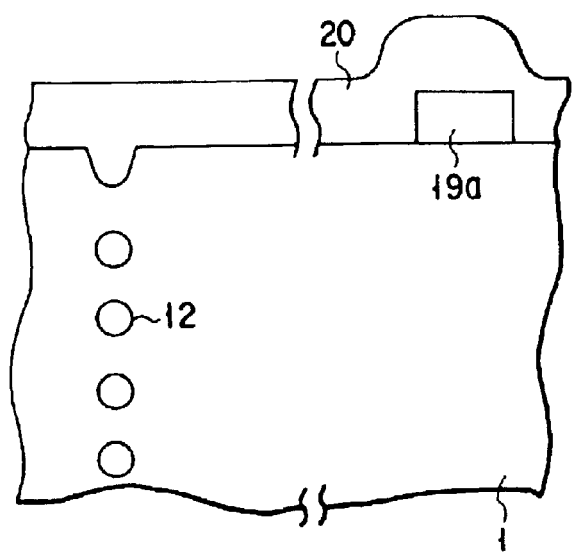

Next, as shown in FIG. 11C, an amorphous silicon film 20 is deposited over the whole surface.

Figure 11D:
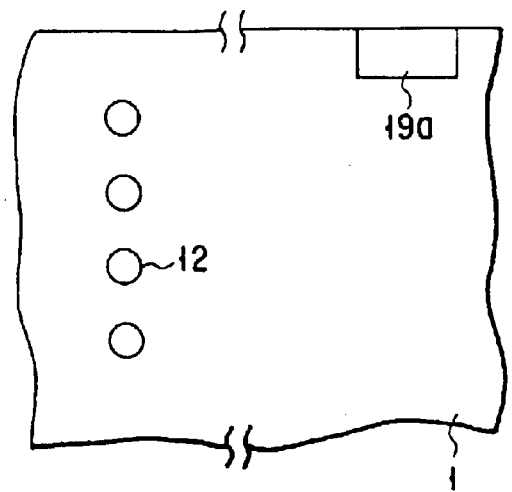

Subsequently, as shown in FIG. 11D, the amorphous silicon film 20 is rendered into single crystal by heat treatment and, at the same time, the surface is flattened; and thereafter, by the use of the etch back method, the CMP method or the like, the surface is made to recede, thus exposing the surface of the mark 19a. In this case, the mark 19a is used as an etching stopper. The exposed surface of the mark 19a is composed of an insulator, which differs in optical properties from the silicon. Therefore, the exposed surface of the mark 19 can be used as an registering mark when the element isolation groove 2 is formed.

Further, the embodiment under contemplation is constituted in such a manner that MOS transistors are formed in the flat portion of the silicon substrate, but the present invention is also applicable to the case where MOS transistors like SGT (Surrounding Gate Transistors) formed on a projected portion of the silicon substrate.

(Second Embodiment)

Figure 12A:
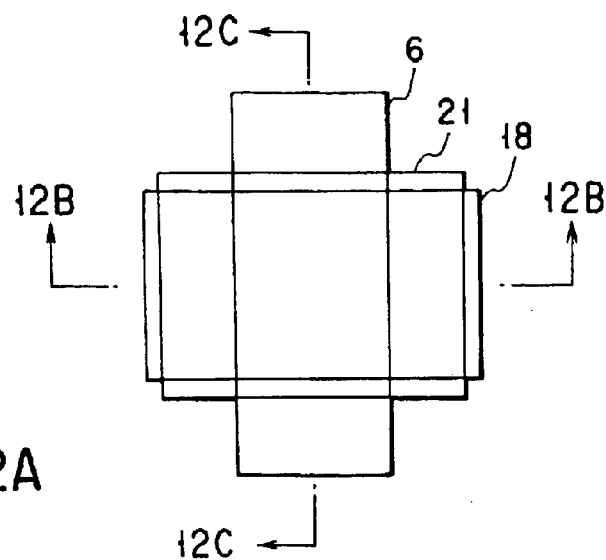
FIGS. 12A to 12C are a plan view and sectional views of the MOS transistor according to a second embodiment of the present invention.
Figure 12B:
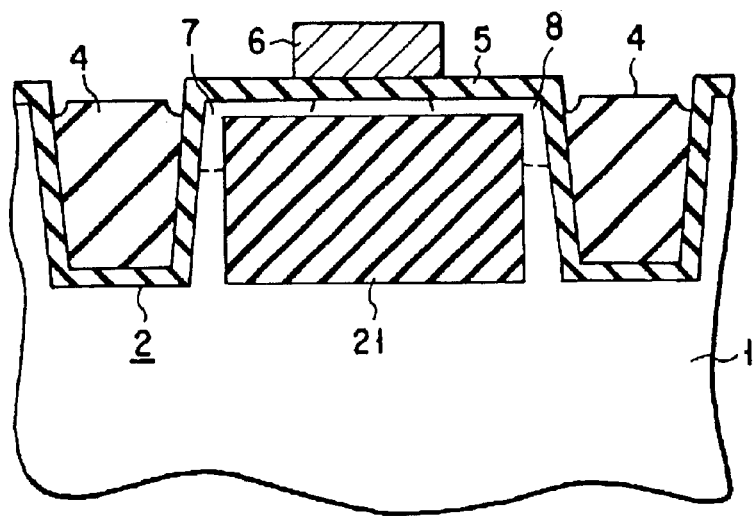
Figure 12C:
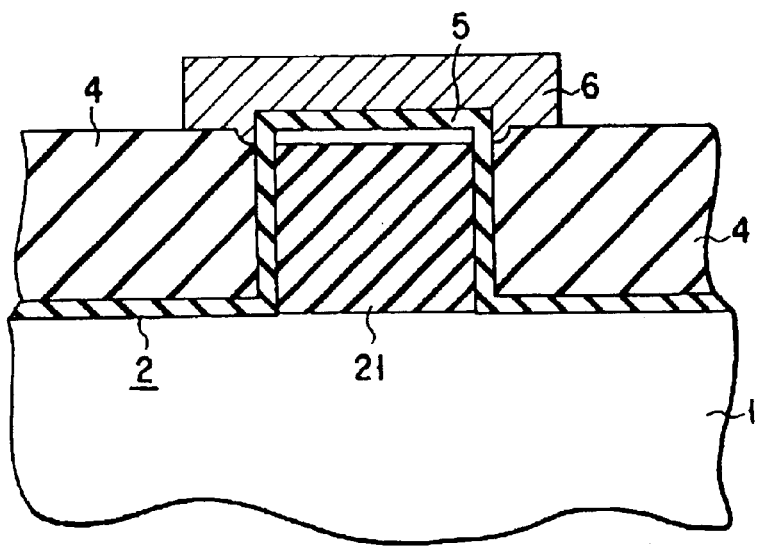

FIGS. 12A to 12C are a plan view and sectional views of the MOS transistor according to a second embodiment of the present invention. In the drawings used here, the same reference numerals (including such reference numerals with different suffixes) as those used in the foregoing drawings denote the same or corresponding portions.

This embodiment differs from the first embodiment in that an insulation film (insulator) 21 in place of the cavity 9. According to this structure, the depletion layers from the diffused source layer 7 and the diffused drain layer 8 stop at the insulation film 21, so that the same effect as that of the first embodiment can be obtained.

Figures 13A, 14A:
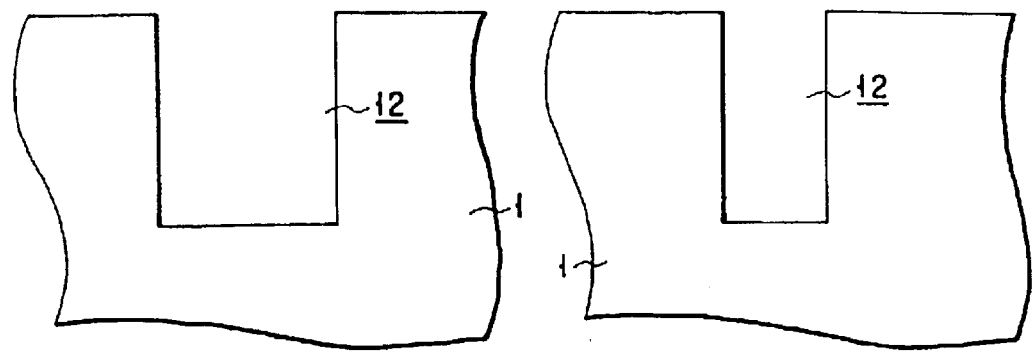
FIGS. 13A to 13C are sectional views parallel to the length directional of the channel showing the respective steps of the method of forming the same MOS transistor.
FIGS. 14A to 14C are sectional views parallel to the width directional of the channel showing the respective steps of the method of forming the same MOS transistor.

FIGS. 12A to 12C are sectional views showing the respective steps of the method of forming the MOS transistor according to this embodiment. First, as in the case of the first embodiment, a groove 12 is formed in the surface of the silicon substrate 1 as shown in FIG. 13A and FIG. 14A.

Figures 13B, 14B:
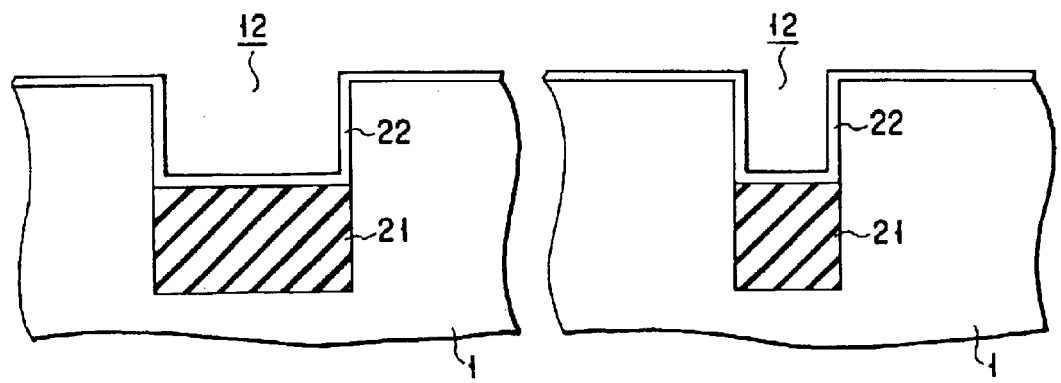

Next, as shown in FIG. 13B and FIG. 14B, the bottom portion of the groove 12 is filled up with an insulation film 21, and then, an amorphous silicon film 22 is deposited to a thickness of, e.g., 100 nm over the whole surface. Used as the insulation film 21 is for example a silicon oxide film.

The filling of the groove by the insulation film 21 is carried out in the following manner by way of example. First, the groove 12 is formed, and then, an insulation film is deposited on the whole surface. Subsequently, by the use of the silicon substrate 1 as a stopper, the above-mentioned insulation film is polished by the CMP method, whereby the above-mentioned insulation film is left only within the groove 12. Finally, etch-back is carried out by the use of RIE method to leave the insulation film only in the bottom portion of the groove, thus forming the insulation film 21.

Here, even if time-controlled wet etching is performed in place of the RIE, it is likewise possible to form the insulation film 21 only in the bottom portion of the groove. For example, in case a silicon oxide film is used as the insulation film 21, an aqueous hydrofluoric acid solution is used as the etchant.

Subsequently, heat treatment is carried out in a reducing atmosphere under reduced pressure such e.g., 10 Torr at a high temperature of 1100° C. or higher. By this heat treatment, the amorphous silicon film 22 epitaxially grows, through solid-phase growth, from the substrate side into a single-crystalline silicon film, becoming integral with the silicon substrate 1. As a result, as shown in FIG. 12C, the interior of the groove 12 is filled up with the single-crystalline silicon, and at the same time, the substrate surface is flattened.

Further, in case the amorphous silicon film 22 is not deposited, the interior portion of the groove 12 which lies on the insulation film 21 cannot be filled up. Therefore, as in the case of this embodiment, it is necessary to deposit an amorphous silicon film 22 with such a thickness (of 100 nm in this embodiment) as to allow an easy crystallization thereof by solid phase growth.

Hereafter, in accordance with the step of the first embodiment shown in FIG. 2E and FIG. 3E, the MOS transistor is formed. However, the step of forming the thermal oxide film 10 covering the inner surface of the cavity 9 is not necessary.

Further, the plane pattern of the groove 12 may alternatively a rectangular shape with a larger long-short side ratio as in the case of a third embodiment to be described below.
(Third Embodiment)

FIGS. 15A to 15D and FIGS. 16A to 16D are sectional views showing the respective steps of the method of forming the MOS transistor according to a third embodiment of the present invention. In the case of this embodiment, a rod-shaped insulation film is used in place of the rod-shaped cavity shown in FIGS. 5A to 5C.

Figures 13C, 14C:
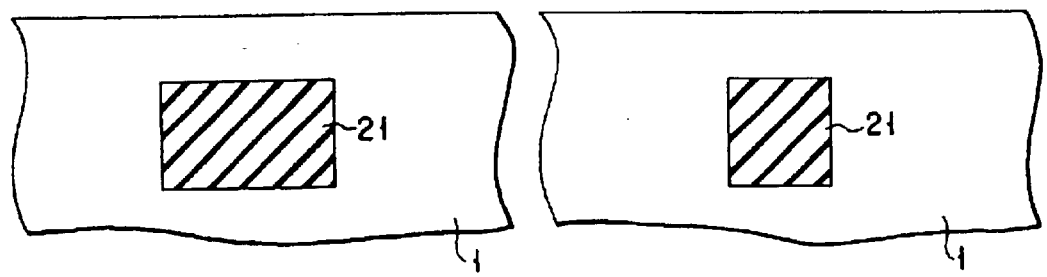

First, as shown in FIG. 15A and FIG. 16A, the bottom portion of the groove 12 is filled up with the insulation film 21, and then, the amorphous silicon film 22 is deposited over the whole surface. Here, it should be noted that the plan pattern of the groove 9s shown in FIG. 15 and FIG. 16 is a rectangular shape with a long-short side ratio larger than that of the plan pattern of the groove 12 shown in FIGS. 12A to 12C. and FIGS. 14A to 14C.

Next, by performing a high-temperature heat treatment in a reducing atmosphere, the interior of the groove 12 is filled up with a single-crystalline silicon film and, at the same time, the substrate surface is flattened as shown in FIG. 15B and FIG. 16B Up to this step, the method according to this embodiment is basically identical with that of the second embodiment.

Figure 7A:
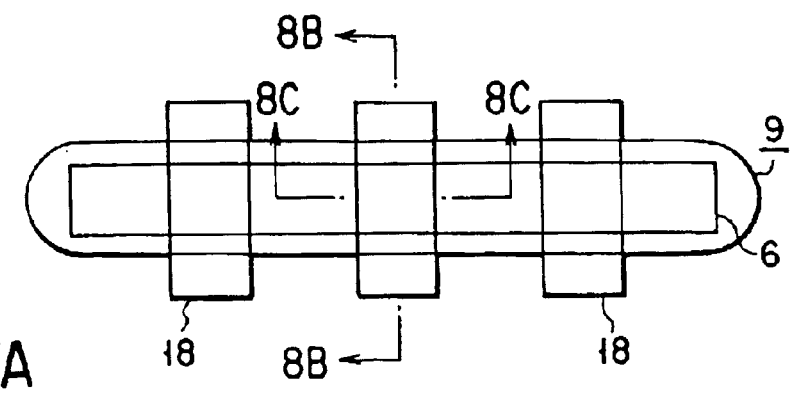
FIGS. 7A to 7C are a plan view and sectional views showing a MOS transistor having the cavity shown in FIGS. 5A to 5D.
Figure 7B:
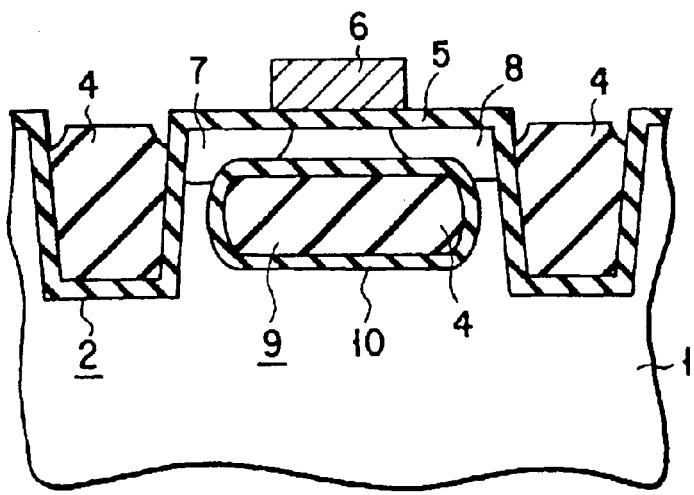
Figure 7C:
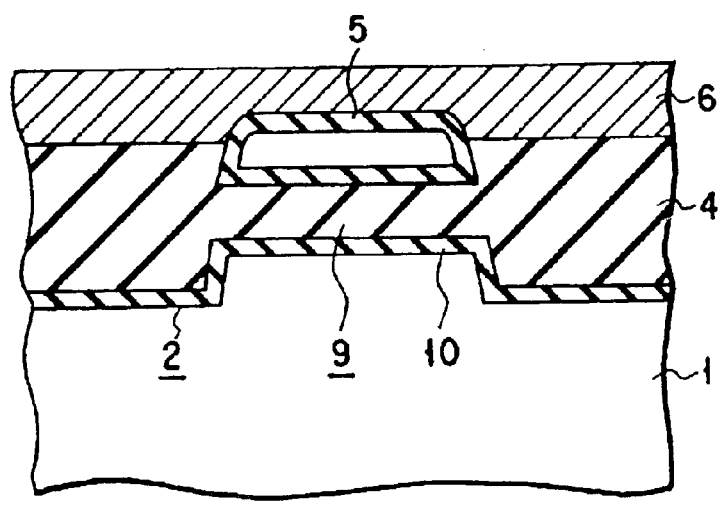

However, the size of the groove 12 is of such a size as to allow a plurality of MOS transistor forming regions 18 to be formed as shown in FIG. 7A. Accordingly, the sectional views shown in FIGS. 15A to 15D and FIGS. 16A to 16D, that is, respectively the sectional views taken along the length directional of the channel and the width directional of the channel are both alike sectional views of a region ranging over a plurality of MOS transistor forming regions unlike in the case of FIGS. 13A to 13C and FIGS. 14A to 14C(one MOS transistor).

Next, as shown in FIG. 15C and FIG. 16C, a groove 12a is formed so as to remove the peripheral edge portion of the insulation film 21, that is, so as to expose the side surface of the insulation film 21.

Subsequently, as shown in FIG. 15D and FIG. 16D, the insulation film 21 is removed by wet etching, whereby a space 9s which constitutes a cavity communication with the groove 12 is formed. Here, it is added that, if the insulation film 12 is a silicon oxide film for example, then it is preferable to remove it by the use of an aqueous hydrofluoric acid solution.

Figure 6D:
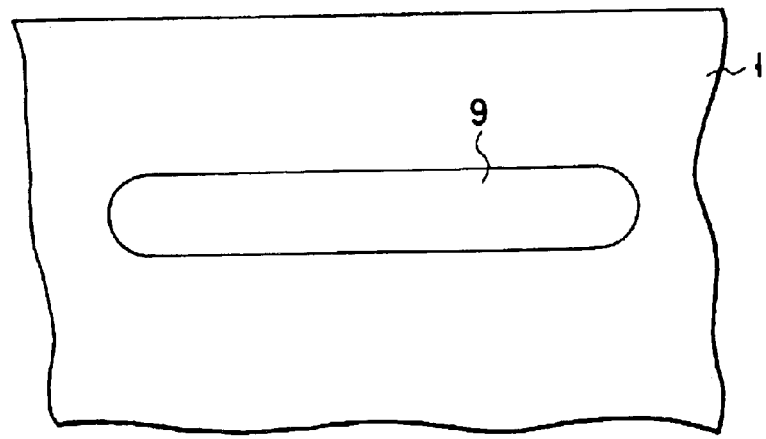

In the case of this embodiment, the cavity 9 is formed without utilizing the migration of the surface silicon, so that the corner portions thereof form acute angles unlike in the case of FIG. 6D. Further, in the case of this embodiment, the shape of the cavity 9 can be more easily controlled than in the case of using the migration of the surface silicon.

Next, the portion of the silicon substrate 1 which lies on the cavity 9 is subjected to patterning to form an element isolation groove (not shown), whereby, as shown in FIG. 7A, a plurality of MOS transistor forming regions 18 are formed, and then, the interiors of the cavity 9, the groove 12a and the element isolation groove are filled up with an insulation film.

In this case, the portion of the silicon substrate 1 which lies on the groove 12a is divided into a plurality of regions by the element isolation groove, that is, the groove 12a is connected to a plurality of element isolation grooves, so that the interior of the groove 12a can be easily filled up with the above-mentioned insulation film. Further, even if a cavity is left in the interior of the groove 12a, this cavity causes no trouble since it fulfills the same function as that of the insulation film within the groove 12a.

Finally, in accordance with the ordinary process, a plurality of MOS transistors are formed. Even in case the plurality of MOS transistors are formed in this way, the same effect as that of the first embodiment can also be obtained.
(Fourth Embodiment)

Figure 17A:
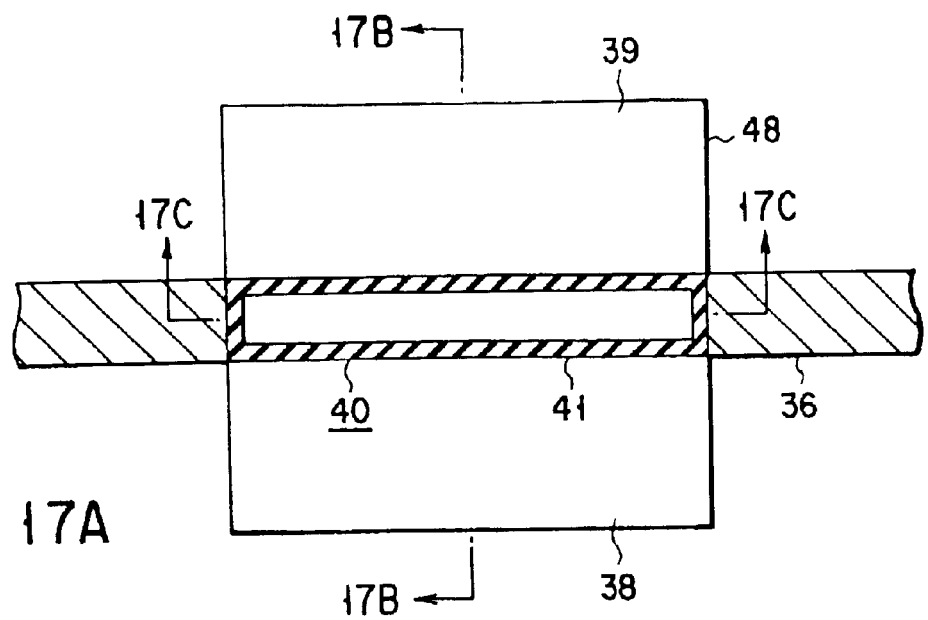
FIGS. 17A to 17C are a plan view and sectional views of the MOS transistor according to a fourth embodiment of the present invention.
Figure 17B:
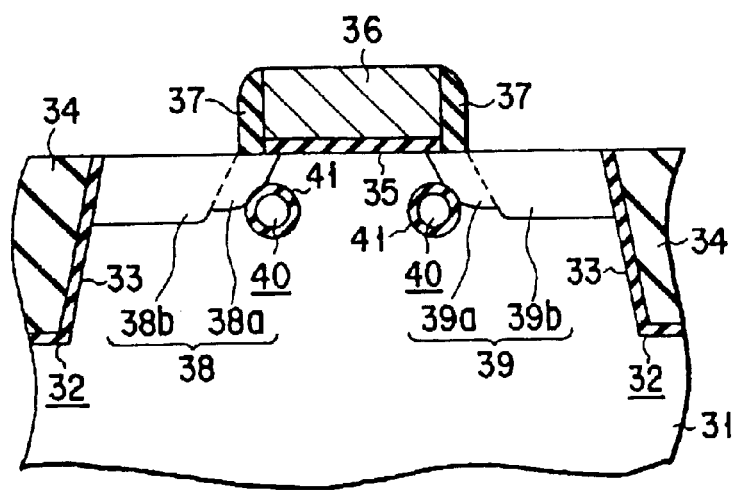
Figure 17C:
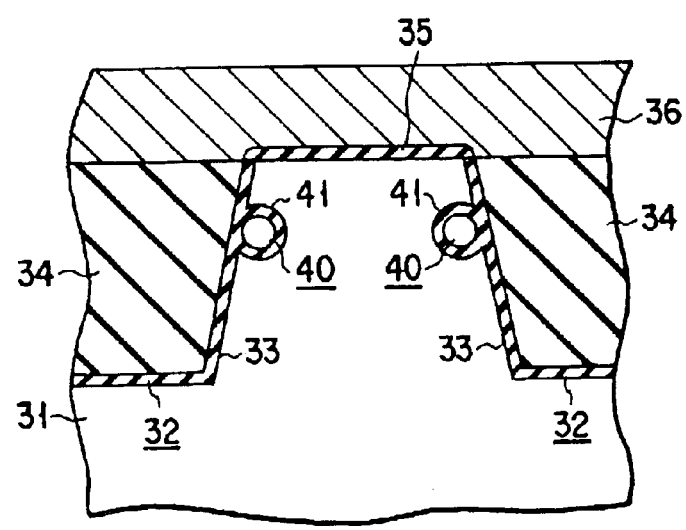

FIGS. 17A to 17C are a plan view and sectional views of the MOS transistor according to a fourth embodiment of the present invention, of which FIG. 14A is a plan view, FIG. 17B is a sectional view taken along the parallel to the length directional of the channel in FIG. 17A and seen therefrom, and FIG. 17C is a sectional view taken along the parallel to the width directional of the channel in FIG. 14A an seen therefrom.

Referring to these drawings, numeral 31 denotes a silicon substrate. On the surface of this silicon substrate 31, a shallow element isolation groove 32 is formed for element isolation (STI). The interior of this element isolation groove 32 is filled up with a silicon oxide film 34 through a thermal oxide film 33.

On the portion of the silicon substrate 31 in which a MOS transistor forming region 48 defined by the element isolation groove 32 lies, a gate electrode 36 is formed through a gate insulation film 35. On the side wall of this gate electrode 36, a gate side wall insulating film 37 is formed. The gate electrode 36 is comprised of a polycrystalline silicon film, a laminated film consisting of a polycrystalline silicon film and a metal silicide film, or a metal film.

Further, in the surface of the silicon substrate 31, s diffused source layer 38 and a diffused drain layer 39 are formed in a state facing each other through the gate electrode 36. The diffused source layer 37 is comprised of a shallow diffused layer (extension layer) 38a with a low impurity atom concentration and a deep diffused layer 38b with an impurity atom concentration higher than that of the diffused layer 38a. The diffused layer 38a is formed in a region closer to the gate electrode 36 than the region in which the diffused layer 38b is formed.

Formed beneath the channel region of the MOS transistor is cavity 40. The cavity 40 abuts on the corner portions of the shallow diffused layers 38a and 39a. The cavity 40 is rectangular in shape when seen from above the element. The inner surface of this cavity 40 is covered with a thermal oxide film 41.

According to this embodiment, the spread of the depletion layers from the diffused source layer 38 and the diffused drain layer 39 stop at the cavity 40, and therefore, there can be obtained the same effects as those of the first embodiment, such as, e.g., the effect that, even if the structural minuteness of the MOS transistor is furthered, the short channel effect can be effectively suppressed.

Further, the MOS transistor according to this embodiment can be formed without causing a misalignment between the cavity 40 and the diffused source layer 38 and a misalignment between the cavity 40 and the drain layer 39 as will be clarified below. Due to this, even if a large number of MOS transistors according to this embodiment are formed, the dispersion in the element characteristics thereof is sufficiently small. Accordingly, by the use of the MOS transistors according to this embodiment, a semiconductor integrated circuit with a high yield can be realized.

Next, the method of forming the MOS transistor according to this embodiment will be described. FIGS. 18A to 18K and FIGS. 19A to 19I are sectional views showing the respective steps of the above-mentioned forming method. FIGS. 18A to 18K are sectional views taken in parallel to the direction of the channel length, while FIGS. 19A to 19I are sectional views taken in parallel to the direction of the channel width. However, the element isolation groove is not shown.

Figure 18A:
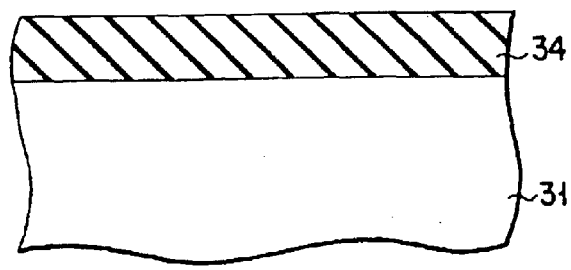
FIGS. 18A to 18K are sectional views parallel to the length directional of the channel showing the respective steps of the method of forming the same MOS transistor.
Figure 19A:
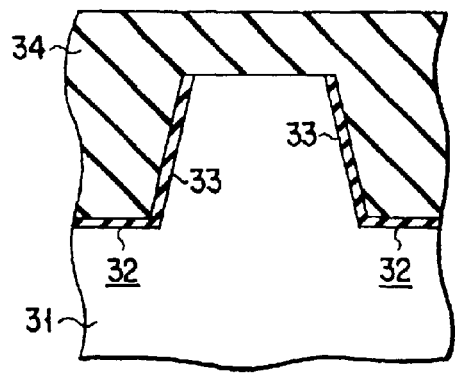
FIGS. 19A to 19I are sectional views parallel to the length directional of the channel showing the respective steps of the method of forming the same MOS transistor.

First, in the silicon substrate 31, the element isolation groove 32 with its inner surface covered by the thermal oxide film 33 is formed by the use of a known technique as shown in FIG. 18A and FIG. 19A. Subsequently, a silicon oxide film 34 as an element isolation insulating film is deposited over the whole surface in such a manner as to fill up the interior of the element isolation groove 32.

Figure 18B:
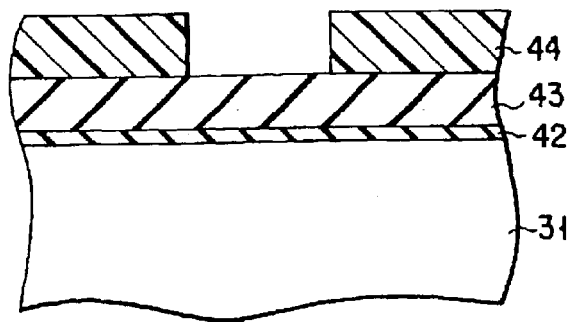
Figure 19B:
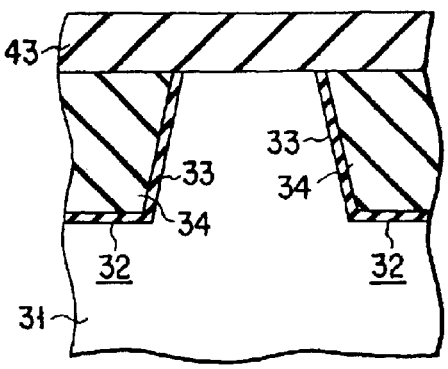

Next, as shown in FIG. 18B and FIG. 19B, the portion of the silicon oxide film 34 which lies outside the element isolation groove 32 is removed by CMP to flatten the surface, and then, a silicon oxide film 42, a silicon nitride 43 and a photoresist pattern 44 are successively formed on the silicon substrate 31.

Figure 18C:
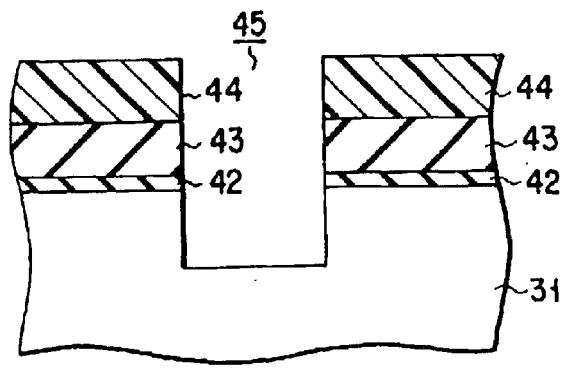
Figure 19C:
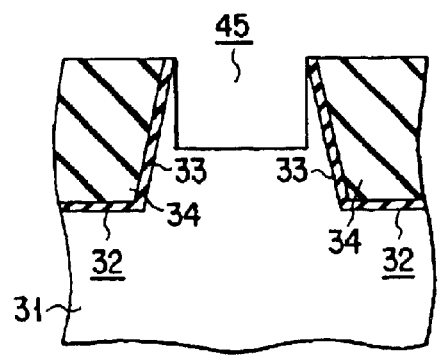

Next, as shown in FIG. 18C and FIG. 19C, a groove 45 is formed in such a manner that, by the use of the photoresist pattern 44 as a mask, the silicon nitride film 43 and the silicon oxide film 42 are successively patterned by performing an anisotropic etching such as, e.g., RIE, and subsequently, by the use of the photoresist pattern 44, the silicon nitride film 43 and the silicon oxide film 42 as a mask, the silicon substrate 31 is anisotropically etched to form the groove 45. After this, the photoresist pattern 44 is carbonized for removal thereof.

Figure 18D:
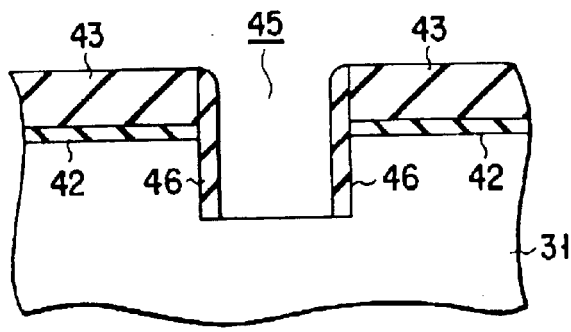
Figure 19D:
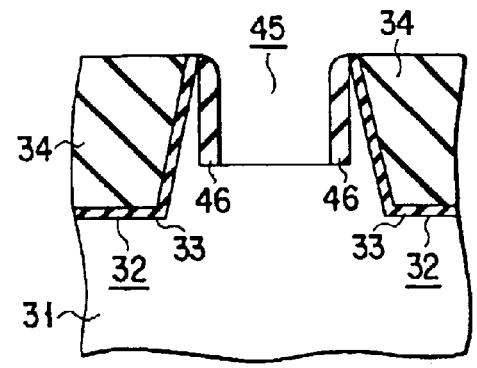

Next, as shown in FIG. 18D and FIG. 19D, a silicon oxide film 46 is formed on the side wall of the groove 45. This silicon oxide film 46 can be formed in such a manner that, after a silicon oxide film is formed on the whole surface, the whole surface of the silicon oxide film is etched back by RIE, leaving the portion of the silicon oxide film which lies on the side wall of the groove 45.

Figure 18E:
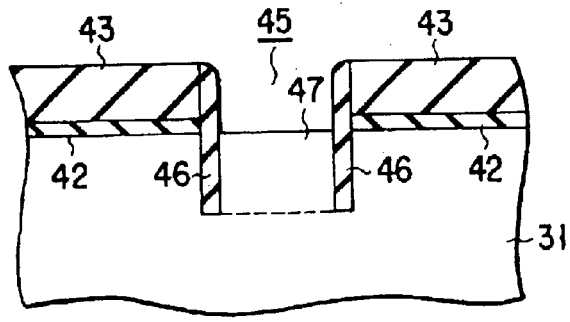
Figure 19E:
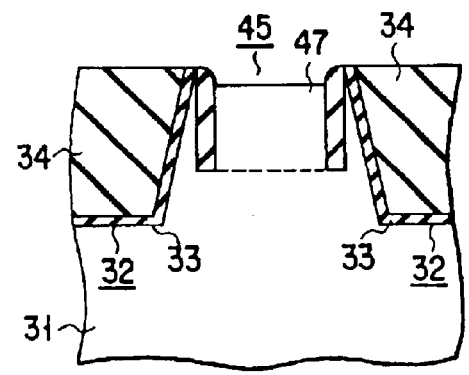
Figure 19F:
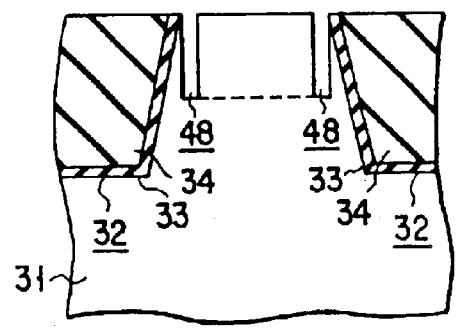

Next, as shown in FIG. 18E and FIG. 19F, in the bottom portion of the groove 45 where the silicon substrate 31 is exposed, an epitaxial silicon layer 47 is selectively grown by the use of, e.g., the low-temperature epitaxial technique using a mixture gas consisting of dichlorosilane and hydrogen chloride. The surface of the epitaxial silicon layer 47 is set so as to lie at a position somewhat higher than or approximately flush with the surface of the silicon substrate 31.

Figure 18F:
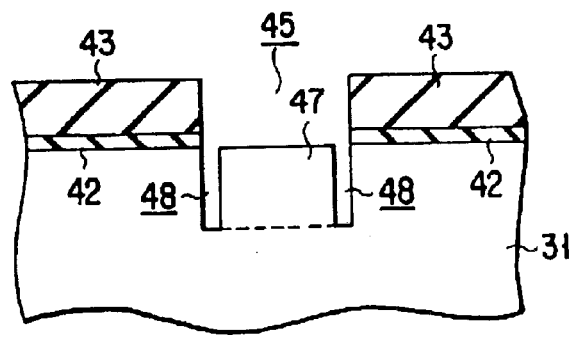

Next, as shown in FIG. 18F and FIG. 19F, the silicon oxide film 46 is removed by the use of the wet etching method using a hydrofluoric acid solution. As a result, between the epitaxial silicon layer 47 and the silicon substrate 31, a very narrow groove 48 is formed.

Figure 18G:
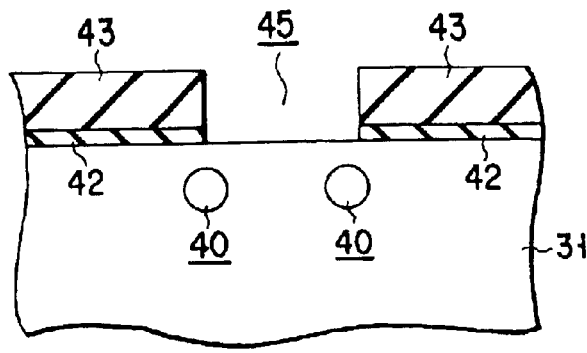
Figure 19G:
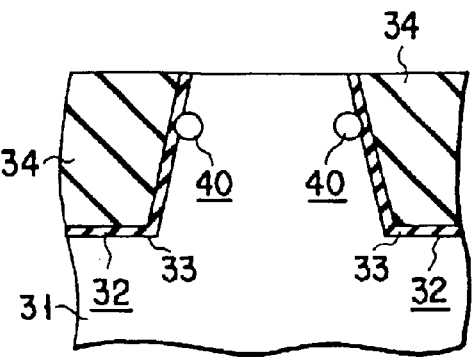

Next, as shown in FIG. 18G and FIG. 19G, a high-temperature annealing is carried out in a deoxidizing atmosphere under reduced pressure such as, e.g., in a 100% hydrogen atmosphere at 10 Torr and at 1000° C. By so doing, the open portion of the groove 48 is closed to form a cavity 40 in the silicon substrate 31 as in the case of the first embodiment.

Through this step, the distinction between the epitaxial silicon layer 47 and the silicon substrate 31 ceases to exist any more, so that the epitaxial silicon layer portion 47 will be also referred to as the silicon substrate 31 from now on.

Figure 18H:
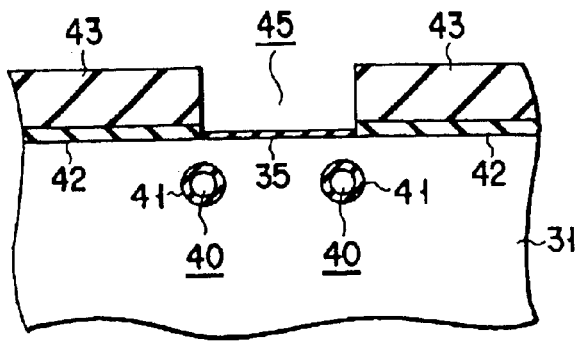
Figure 19H:
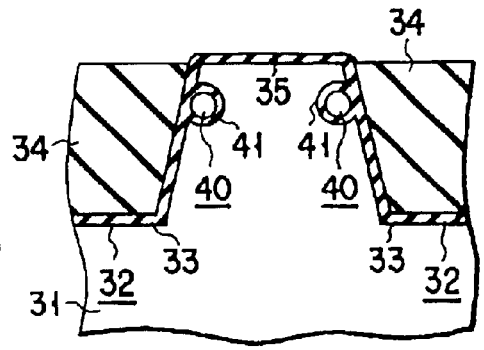

Next, as shown in FIG. 18H and FIG. 19H, the surface portion of the silicon substrate 31 which constitute the bottom of the groove 45 is thermally oxidized to thereby form a gate insulation film 35 on the surface of the silicon substrate 31. The above-mentioned thermal oxidation is performed in, e.g., a mixture gas atmosphere consisting of oxygen and HCl at 900° C. In this case, a very small portion of the oxidizing agent is diffused into the silicon substrate 31, whereby the inner surface of the cavity 40 is also oxidized. As a result, a thermal oxide film 41 is also formed on the inner surface of the cavity 39.

Figure 18I:
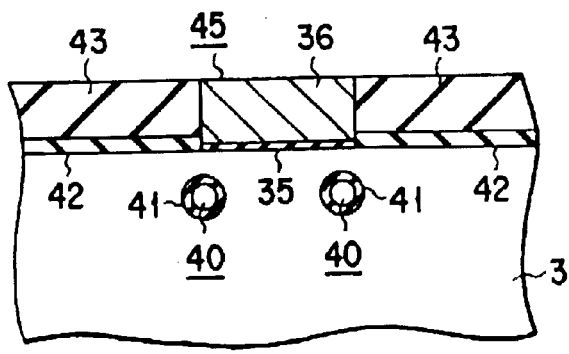
Figure 19I:
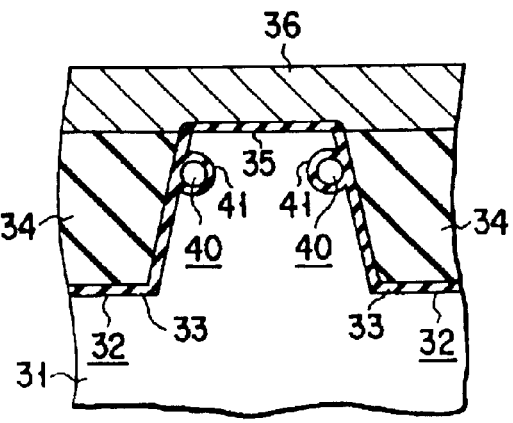

Next, as shown in FIG. 18I and FIG. 19I, the gate electrode 36 is formed within the groove 45. This gate electrode 36 can be formed in such a manner that a polycrystalline silicon film, a laminated film consisting of a polycrystalline silicon film and a metal silicide film, or a metal film is deposited on the whole surface so as to fill up the interior of the groove 45, and then, the unnecessary portion of the film which lies outside the groove 45 is removed by CMP.

Here, the end portion of the gate electrode 36 abuts on the side wall of the groove 45, and, beneath the side wall of the groove 45, the cavity 40 is positioned. In this way, the gate electrode 36 is formed so that the end portion thereof may be positioned on the cavity 40. Thus, no positional shift is caused between the gate electrode 36 and the cavity 40. Further, the depth of the cavity 40 is optimized by suitably selecting the depth of the groove 48. The size of the cavity 40 can be optimized by suitably selecting the thickness of the silicon oxide film 46.

Figure 18J:
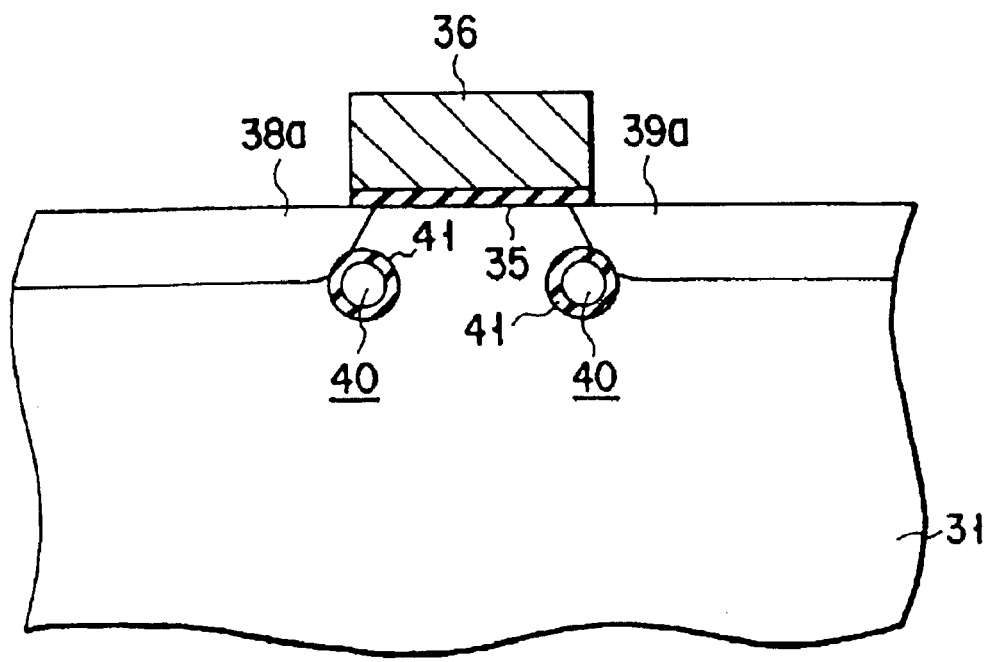

Next, as shown in FIG. 18J, the silicon nitride film 43 and the silicon oxide film 42 are removed. The silicon nitride film 43 is removed by the use of a heated $H_3PO_4$ solution. Next, as also shown in FIG. 18K, by the use of the gate electrode 36 as a mask, impurity ions are implanted into the silicon substrate 31, and then, annealing for activating the impurity ions is performed to form the diffused source layer 38a and the diffused drain layer 39a.

Finally, as shown in FIG. 18J, the gate side wall insulating film 37 is formed. By the use of this gate side wall insulating film 37 and the gate electrode 36 as a mask, impurity ions are implanted into the silicon substrate 31, and then, an annealing is performed for activating the above-mentioned impurity ions to form the diffused source layer 37b and the diffused drain layer 38b, thus completing the MOS transistor shown in FIGS. 17A to 17C.

Figure 18K:
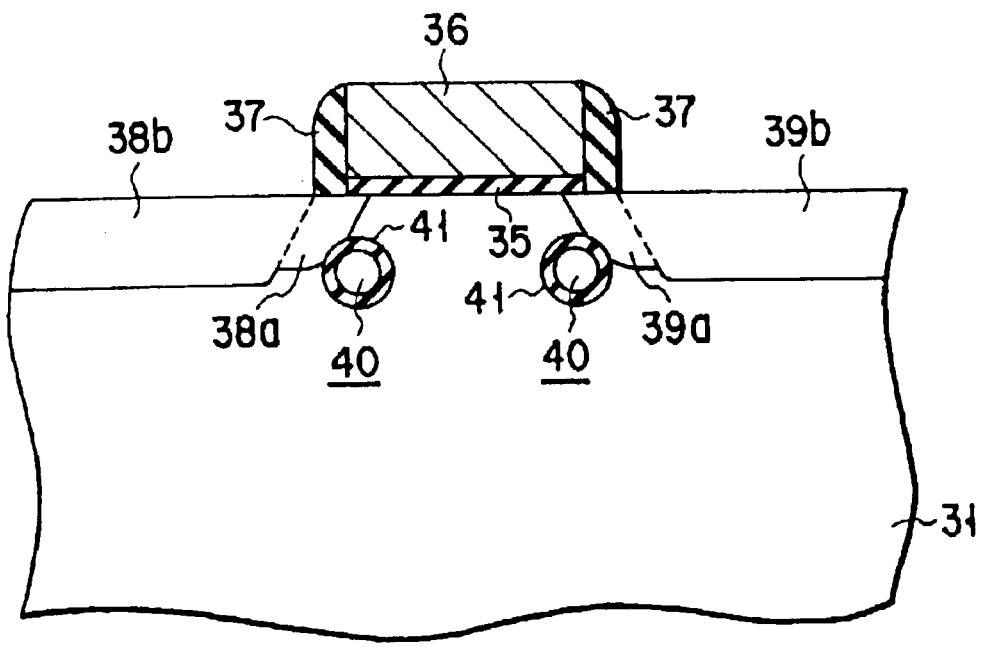

In this case, it is alternatively possible to omit the annealing at the step shown in FIG. 18J and, instead, to perform the activation of impurity ions jointly by the ion-activating annealing performed at the step shown in FIG. 18K.

(Fifth Embodiment)

Figure 20A:
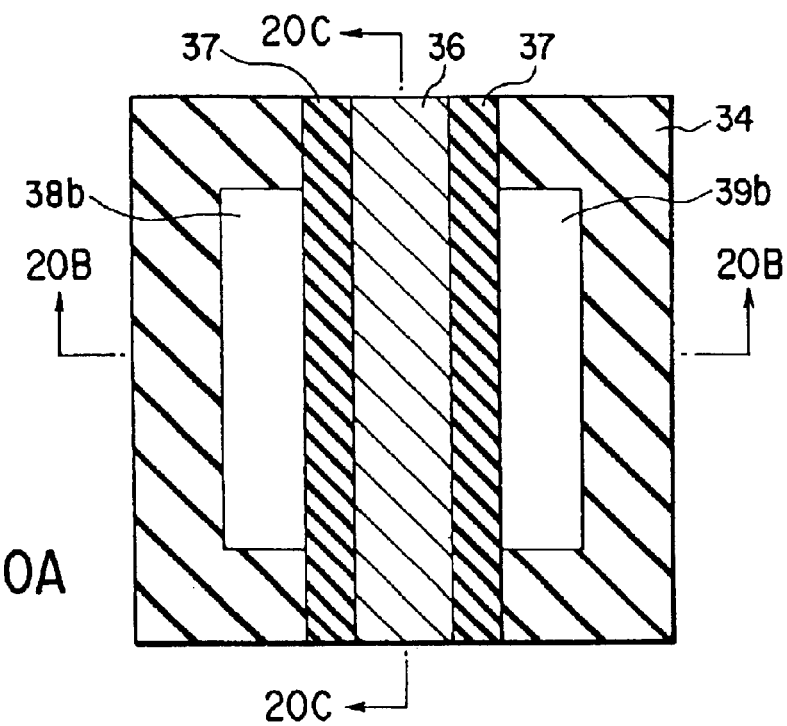
FIGS. 20A to 20C are a plan view and sectional views of the MOS transistor according to a fifth embodiment of the present invention.
Figure 20B:
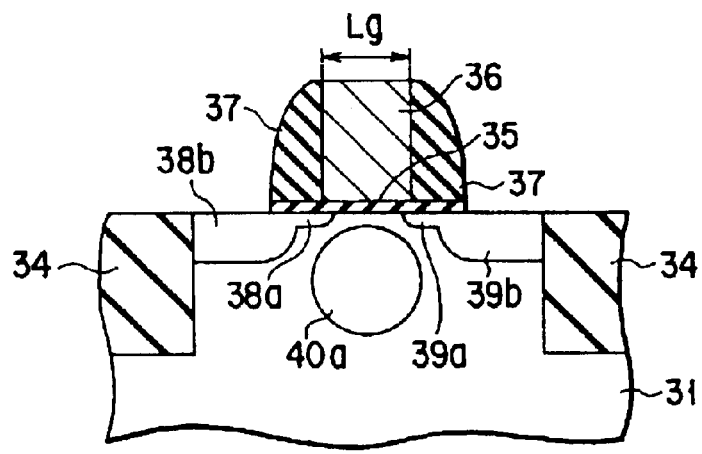
Figure 20C:
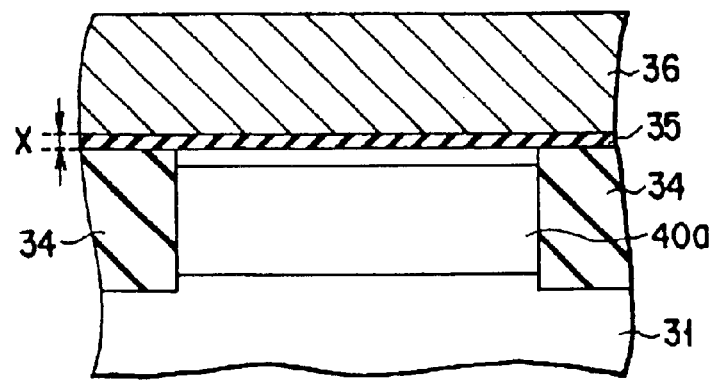

FIGS. 20A to 20C are a plan view and sectional views of the MOS transistor according to a fifth embodiment of the present invention; FIG. 20A is a plan view, FIG. 20B is a sectional view taken along the parallel to the length directional of the channel in FIG. 20A and seen therefrom, and FIG. 20C is a sectional view taken along the parallel to the width directional of the channel in FIG. 20A and seen therefrom.

This embodiment differs from the first embodiment in respect of the shape and position of the cavity 40a. The shape of the cavity 40a is cylindrical, and both end faces (the upper face and the lower face) of the cavity 40a abut on the silicon oxide film 34 functioning as an element isolation insulating film, respectively. The section, in the direction of the gate width, of the cavity 40a is set in such a manner the distance X between the gate insulation film 35 and the cavity 40a is uniform.

Figure 21:
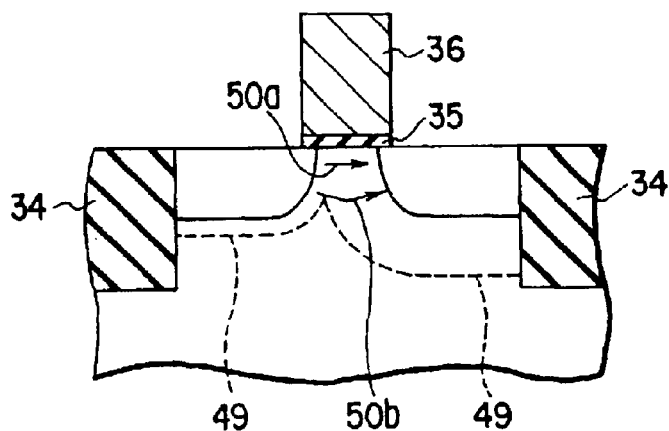
FIG. 21 is a sectional view used for explaining the problematic points of a conventional minute-structured MOS transistor which has a gate length of 0.2 μm or less.

In the case of a conventional minute-structured MOS transistor with a gate length of 0.2 μm or less, both depletion layers 49 are contacted with each other in a region (a region apart from the gate electrode 36) in which the influence by the potential of the gate electrode 36 is small, as shown in FIG. 21, so that a drain current 50b flows even in a location far away from the gate insulation film 35 as well as in the vicinity of the gate insulation film 35 in which a drain current 50a is naturally to flow. This drain current 50b is a current which does not depend on the gate voltage and thus becomes a cause for a short channel effect.

As a measure for suppressing the spread of the depletion layers 49, there is known the measure of enhancing the impurity atom concentration of the diffused source layer and the diffused drain layer. However, in the case of a minute element with a gate length of 0.2 μm or less, the impurity atom concentration of the diffused source layer and the diffused drain layer thereof is close to $1 \times 10^{18}$ cm$^{-3}$, and therefore, if the impurity atom concentration is further enhanced, there will be caused other troubles. For example, an increase in the junction leakage current in the diffused source layer and the diffused drain layer and an increase in the junction capacitance.

Figure 22:
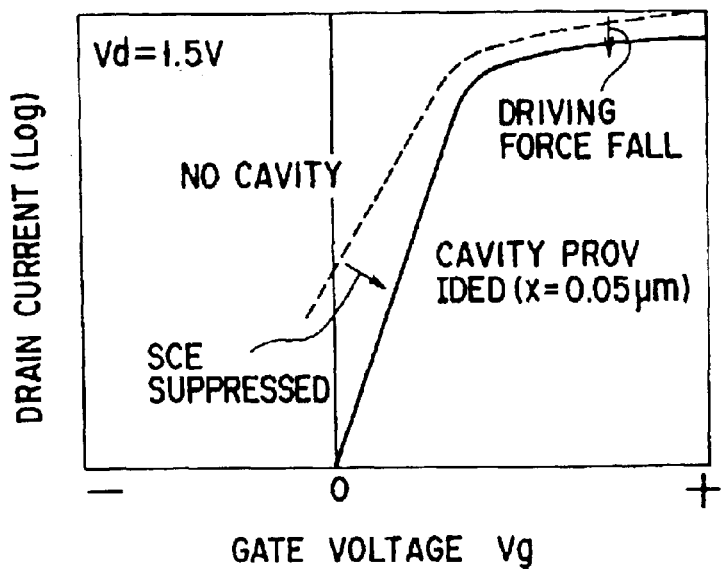
FIG. 22 shows a Vg-Id characteristic curve diagram explaining the effect of the MOS transistor shown in FIGS. 20A to 20C.

In contrast, according to this embodiment, the flow path of the drain current which does not depend on the gate voltage is divided by the cavity 40a, so that the drain current which does not depend on the gate voltage ceases to flow between the source and the drain. Thus, it follows that, even if the impurity atom concentration of the diffused source layer and the diffused drain layer is not enhanced, the short channel effect (SCE) is suppressed as shown in FIG. 22, unlike in the case of the conventional MOS transistor provided with no cavity 40a.

Here, it is added that the result of the researches made by the present inventors reveals that the "short channel effect" suppressing effect brought about by the provision of the cavity 40a varies with the position of the cavity 40a. This fact will be described below.

Figure 23:
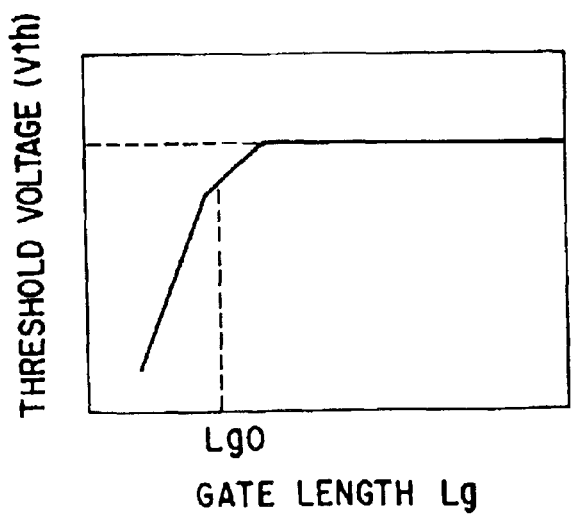
FIG. 23 is a characteristic curve diagram showing the relationship between the gate length Lg and the threshold voltage of a MOS transistor which is of the LDD structure and has a cavity.

FIG. 23 is a characteristic curve diagram showing the relationship between the gate length Lg and the threshold voltage $V_{th}$ of a MOS transistor which comprises an LDD structure and is provided with a cavity 40a (gate length and impurity concentration in substrate is kept constant). The degree of deterioration in the element characteristics due to the short channel effect at a certain small gate length Lg can be expressed as the difference $\Delta V_{th}$ ($V_{thL}-V_{th0}$) between the threshold voltage $V_{thL}$ in case the gate length is long (the gate length Lg>>1 μm) and the threshold voltage $V_{th0}$ in case the gate length is Lg0. It is understood that, as $V_{th}$ increases, the degree of deterioration in the element characteristics due to the short channel effect is increased.

Figure 24:
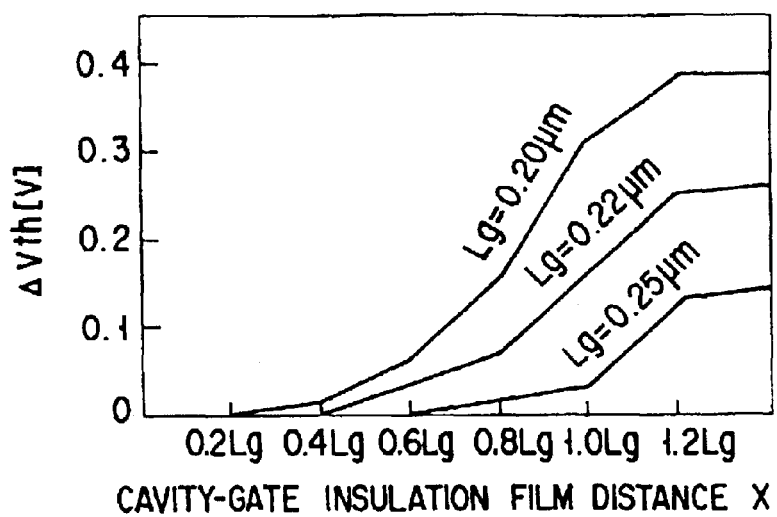
FIG. 24 is a characteristic curve diagram showing the relationship between the amount of fall of the threshold voltage and the gate length and the cavity-gate insulation film distance.

FIG. 24 is a characteristic curve diagram showing the relationship between the amount of reduction $\Delta_{Vth}$ of this threshold voltage, the gate length Lg, and the distance X between the cavity and the gate insulation film. From this FIG. 24, it is understood that, as the distance X between the cavity and the gate insulation film becomes shorter, that is, as the cavity 40a becomes closer to the gate insulation film 35, the "short channel effect" suppressing effect brought about by the cavity 40a is increased.

However, it is not that, the closer to the gate insulation film 35 the cavity 40a is, the better the result is. It is because the cavity 40a possesses the function of lowering the driving force of the element as shown in FIG. 22.

Figure 25:
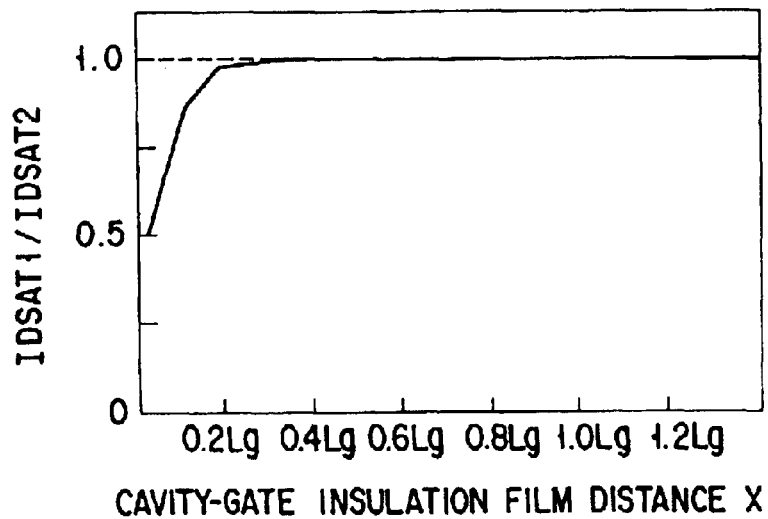
FIG. 25 is a characteristic curve diagram showing the relationship between the Idsat1 (cavity present)/Idsat2 (no cavity) and the cavity-gate insulation film distance.

FIG. 25 is a characteristic curve diagram showing the relationship between Idsat (cavity present)/Idsat (no cavity) and the distance X between the cavity and the gate insulation film. From FIG. 25, it is understood that the lowering tendency of the driving force sharply increases when the distance X between the cavity and the gate insulation film becomes shorter than 0.1 time the gate length Lg.

Therefore, by setting 0.1 Lg<X, it becomes possible to suppress the short channel effect without bringing about a reduction in the driving force. The upper limit of the distance X between the cavity and the gate insulation film is, for example, Lg.

Figure 26:
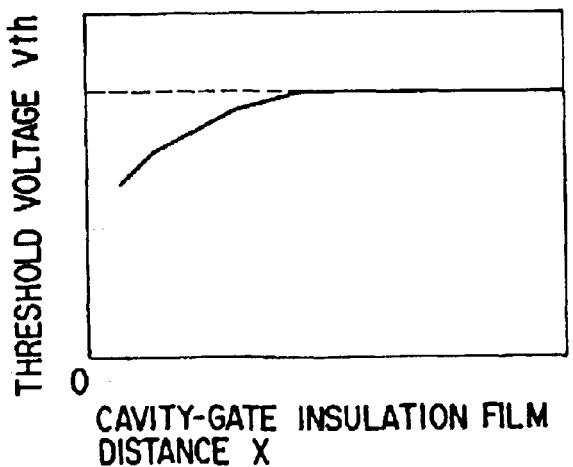
FIG. 26 is a characteristic curve diagram showing the relationship between the cavity-gate insulation film distance and the threshold voltage.

Further, the result of the researches made by the present inventors also reveals that, as shown in FIG. 26, the threshold voltage $V_{th}$ can be controlled by the distance X between the cavity and the gate insulation film. That is, it has been clarified that, by decreasing the distance X between the cavity and the gate insulation film, the threshold voltage can be lowered.

By utilizing this phenomenon, it becomes possible to give a solution to the conventional problem that, in case the gate electrode of a minute-structured MOS transistor which has a gate length of 0.2 μm or less is formed of a metal, it is difficult to adjust the threshold voltage to a low value.

FIGS. 27A to 27D are sectional views showing the respective steps of the method of forming the MOS transistor according to this embodiment. All these views are those sectioned along the arrowed line A–A' in FIGS. 17A to 18C and seen from the arrowed direction.

Figure 27A:
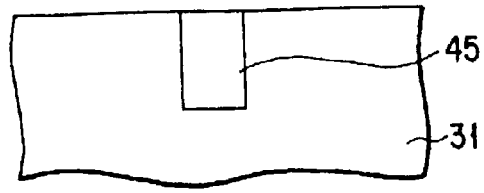
FIGS. 27A to 27D are sectional views showing some steps of the method of forming the MOS transistor shown in FIGS. 20A to 20C.

First, as shown in FIG. 27A, a groove 45 is formed in the surface of the silicon substrate 31. The plane pattern of the groove 45 is a rectangular shape with its long sides extending in the direction of the channel width.

Figure 27B:
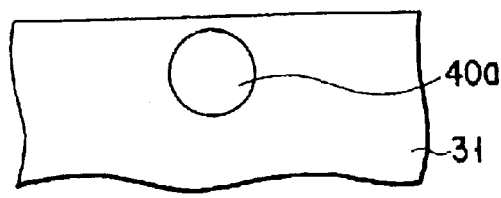

Next, as shown in FIG. 27B, a high-temperature annealing is performed in a deoxidizing atmosphere under reduced pressure such as, e.g., in a 100% hydrogen atmosphere at 10 Torr and at 1000° C., whereby the open portion of the groove 45 is closed to form the cavity 40a in the silicon substrate 31. In the case of this embodiment, the shape of the cavity 40a is cylindrical.

Figure 28A:
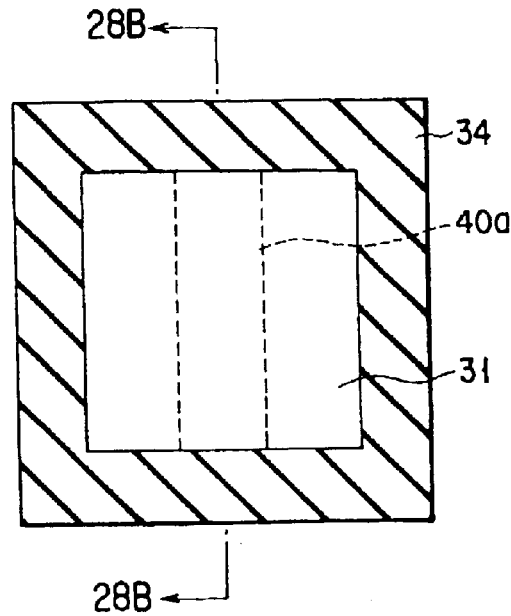
FIGS. 28A and 28B are a plan view and sectional views of the same transistor in the course of the formation thereof.
Figure 27C:
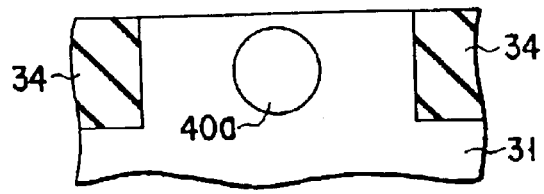
Figure 28B:
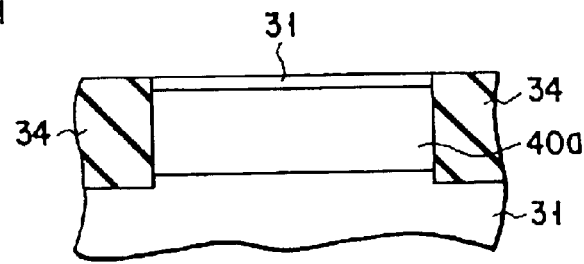

Next, as shown in FIG. 27C, the element isolation groove 32 is formed in the surface of the silicon substrate 31, and the interior thereof is filled up with a silicon oxide film 34 used as an element isolation insulating film. In this case, the element isolation groove 32 is formed in such a manner that both ends of the cavity 40a (the upper face and the lower face of the cylinder) are cut off, and the both ends of the remaining portion of the cavity 40a are made to abut on the silicon oxide film 34. A plan view of the substrate at this forming step is shown in FIG. 28A, and a sectional view taken along the parallel to the width directional of the channel in the plan view of FIG. 28A is shown in FIG. 28B.

Figure 27D:
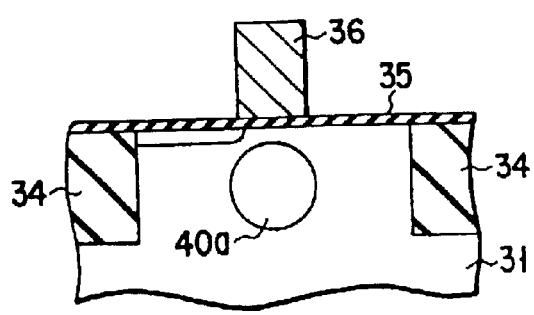

Next, as shown in FIG. 27D, the substrate surface is oxidized to form the gate insulation film 35, and then, a polycrystalline silicon film is formed by deposition on the gate insulation film 35. This polycrystalline silicon film is then patterned to form the gate electrode 36. The patterning of the polycrystalline silicon film is performed so that the gate electrode 36 may be positioned directly above the cavity 40a. Such patterning becomes possible by, e.g., utilizing the registering method shown in FIGS. 10A and 10B and FIGS. 11A to 11D.

After this, the gate side wall insulating film 37, the diffused source layer 38 and the diffused drain layer 39 are formed in the same manner as in the case of the fourth embodiment, thus completing the MOS transistor comprising the LDD structure shown in FIGS. 17A to 17C.

(Sixth Embodiment)

Figure 29A:
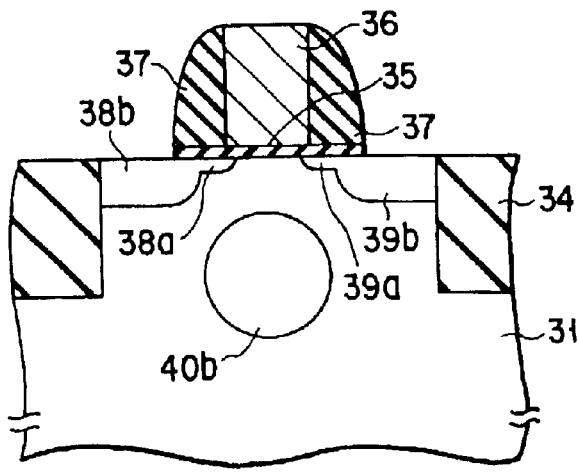
FIGS. 29A and 29B are sectional views of the MOS transistor according to a sixth embodiment of the present invention.
Figure 29B:
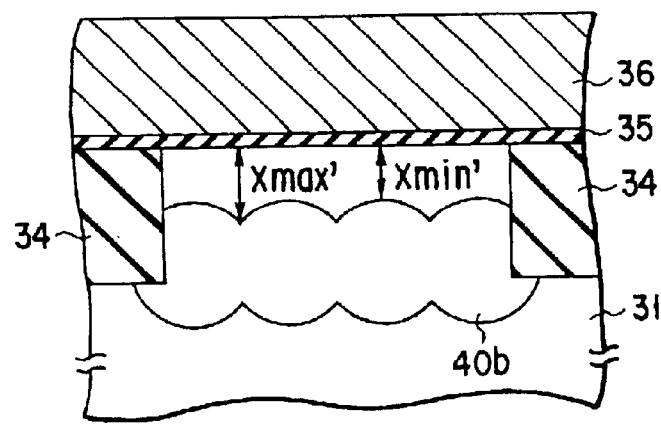

FIGS. 29A and 29B are sectional views showing the MOS transistor according to a sixth embodiment of the present invention, of which FIG. 29A is a sectional view corresponding to that shown in FIG. 20B, and FIG. 29B is a sectional view corresponding to FIG. 20C.

This embodiment differs from the fifth embodiment in that, in the former, as for the direction of the gate width, the distance between the cavity 40b and the gate insulation film 35 (the cavity-gate insulation film distance X') periodically changes. Though the cavity-gate insulation film distance X' periodically changes as mentioned above, the short channel effect can be effectively suppressed as in the case of the fifth embodiment.

In the case of this embodiment, the maximum value X'max and the minimum value $X'_{min}$ of the cavity-gate insulation film distance X' should desirably be both alike set to values larger than 0.1 Lg. Further, the upper limits of $X'_{max}$ and $X'_{min}$ are for example LG as in the case of the fifth embodiment.

Figure 30A:
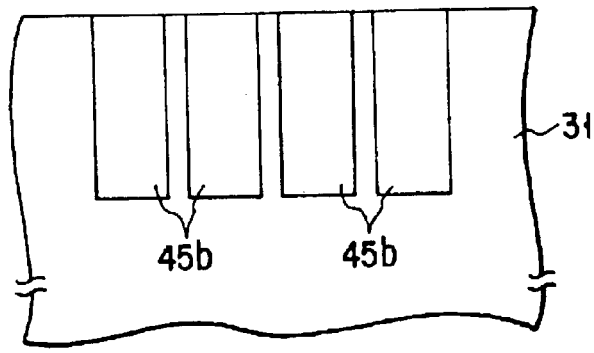
FIGS. 30A and 30B are sectional views showing some steps of the method of forming the same MOS transistor.

In order to form such a MOS transistor, at the forming step of the fifth embodiment shown in FIG. 27A, a plurality of grooves 45b are formed, in place of forming one groove 45, along the direction of the gate width as shown in FIG. 30A. The plane pattern (the pattern of the openings) of these grooves 45b may be square, rectangular or circle. Further, the intervals between the grooves is shortened.

Figure 30B:
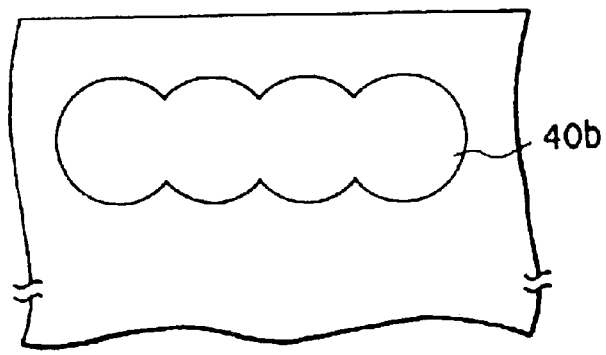

Next, as shown in FIG. 30B, a high-temperature annealing is performed in a deoxidizing atmosphere under reduced pressure to form a cavity 40b shaped like balls linked together. The reason why such a shape is employed lies in the fact that, by the high-temperature annealing, the respective grooves 45b have their open portions closed into spherical cavities, and further, the interval between the respective adjacent grooves 45b is short, so that the mutually adjacent cavities are coupled to each other.

The steps to follow the above-mentioned step are the same as the steps following the step of the fifth embodiment shown in FIG. 27C. In the case of this embodiment, however, the element isolation groove 32 is formed in such a manner that both ends of the cavity 40b shaped like balls linked together are cut off, and both ends of the thus left portion of the cavity 40b come into contact with the silicon oxide film 34.

(Seventh Embodiment)

Figure 31A:
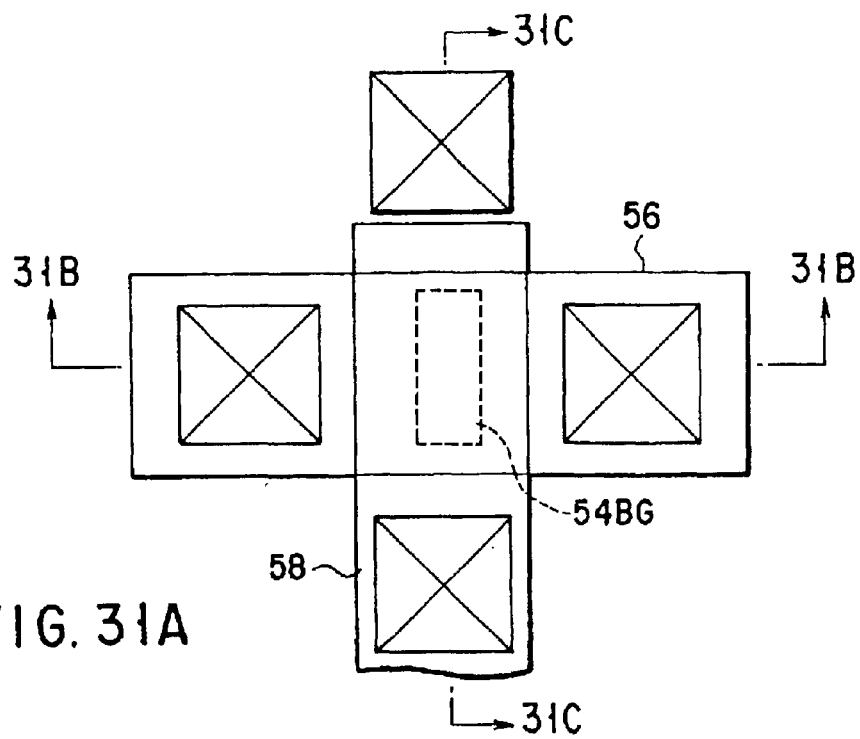
FIGS. 31A to 31C are a plan view and sectional views of the MOS transistor according to a seventh embodiment of the present invention.
Figure 31B:
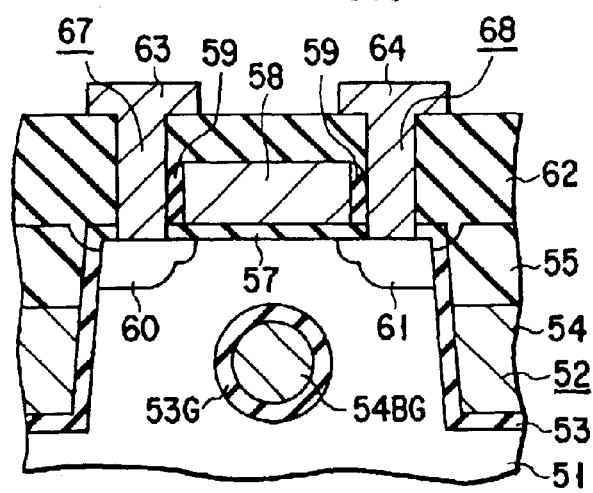
Figure 31C:
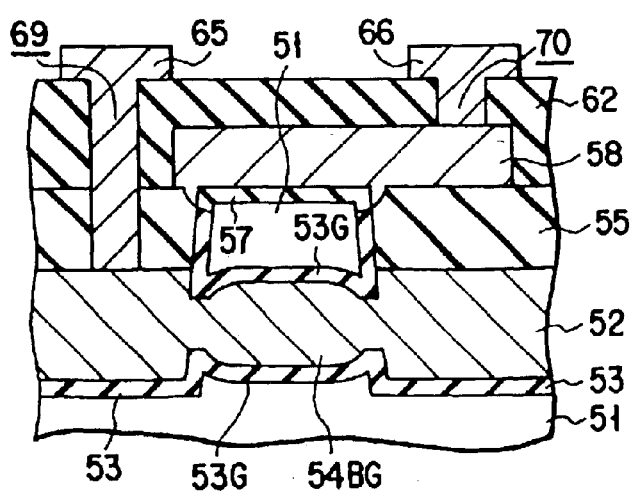

FIGS. 31A to 31C are respectively a plan view and sectional views of the MOS transistor according to a seventh embodiment of the present invention. FIG. 28A is a plan view, FIG. 31B is a sectional view taken along the parallel to the length directional of the channel in FIG. 31A and seen from the direction indicated thereby, and FIG. 31C is a sectional view taken along the parallel to the width directional of the channel in FIG. 28A and seen from the direction indicated thereby.

Referring to these drawings, numeral 51 denotes a silicon substrate. On the surface of this silicon substrate 51, a groove 52 is formed. The region in which this groove 52 is formed is used as an element isolation region as usual and, at the same time, used as a back gate region. The inner surface of the groove 52 is covered with a thermal oxide film 53. The interior of the groove 52 is filled up with a silicon oxide film 55 through a polycrystalline silicon film 54.

On the portion of the silicon substrate 51 which constitutes a MOS transistor region 56, a gate electrode 58 is formed through a first gate insulation film 57. The gate electrode 58 is comprised of a polycrystalline silicon film, a laminated film consisting of a polycrystalline silicon film and a metal silicide film, or a metal film. On the side wall of the gate electrode 58, a gate side wall insulating film 59 is formed. Further, on the surface of the silicon substrate 51, a diffused source layer 60 and a diffused drain layer 61 which are both of the LDD structure are formed.

Buried in the interior of that portion of the silicon substrate 51 which lies beneath of the MOS transistor channel region is a cylindrical back gate electrode $54_{BG}$ extending in the direction of the channel width. The backdate electrode $54_{BG}$ and the polycrystalline silicon film 54 are one and the same polycrystalline silicon film formed through one and the same forming step.

In the MOS transistor region 56, a second gate insulation film $53_G$ is formed in the interface between the back gate electrode $54_{BG}$ and the silicon substrate 51. A second gate insulation film $53_G$ and the thermal oxide film 53 are one and the same thermal oxide film formed through one and the same forming step.

On the MOS transistor, an inter-layer insulation film 62 is deposited. On this inter-layer insulation film 62, metal wirings 63 to 66 are formed. These metal wirings 63 to 66 are electrically connected to the diffused source layer 60, the diffused drain layer 61, the back gate electrode $54_{BG}$, and the gate electrode 58 through connection holes 67 to 70, respectively.

According to this embodiment, by applying a suitable voltage to the back gate electrode 54BG, the spread of the depletion layers in the channel region can be suppressed, and thus, the ON/OFF characteristics of the transistor is improved. Therefore, according to this embodiment, it is ensured that, even if the structural minuteness of MOS transistors is furthered for a further speed increase and a higher degree of integration of integrated circuits, the short channel effect can be effectively suppressed.

Further, according to this embodiment, the region of the silicon substrate 51 in which the MOS transistor is formed is not insulated from the other portions of the silicon substrate 51 unlike in the case of forming a back gate electrode by the use of an SOI substrate. Due to this, there do not arise problems such as, e.g., a substrate floating effect; and thus, a stable element operation can be assured. Further, since the use of an expensive SOI substrate is not needed, there naturally is no problem pertaining to a rise in the manufacturing costs.

Figure 32A:
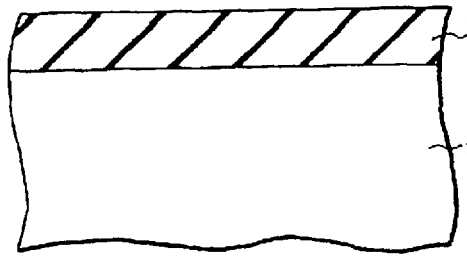
FIGS. 32A to 32N are sectional views parallel to the length directional of the channel showing respective steps of the method of forming the same MOS transistor.
Figure 33A:
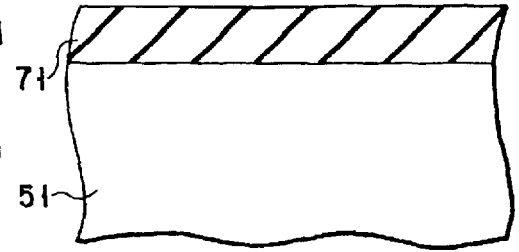
FIGS. 33A to 33N are sectional views showing respective steps of the method of forming the same MOS transistor.

Next, the method of manufacturing the MOS transistor according to this embodiment will be described. FIGS. 32A to 32N and FIGS. 33A to 33N are sectional views showing the respective steps of the forming method. FIGS. 32A to 32N are sectional views parallel to the direction of the channel length, FIGS. 33A to 33N are sectional views parallel to the direction of the channel width.

First, as shown in FIG. 32A and FIG. 33A, an oxide film 71 is formed on the silicon substrate 51.

Figure 32B:
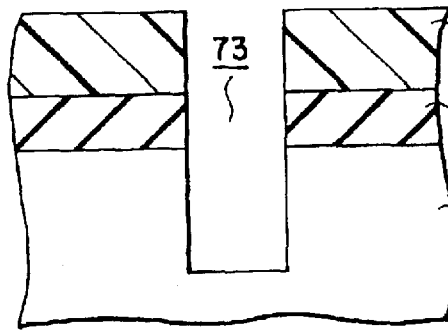
Figure 33B:
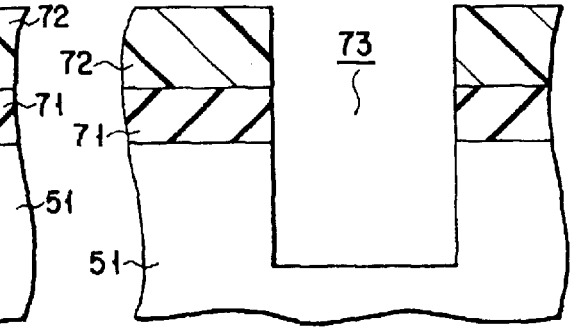

Next, as shown in FIG. 32B and FIG. 33B, a photoresist pattern 72 is formed on the oxide film 71, and then, by the use of an anisotropic etching method such as, e.g., RIE, using this photoresist pattern 72 as a mask, the oxide film 71 and the silicon substrate 51 are patterned to form a groove 73 in the silicon substrate 51. After this, the photoresist pattern 72 is incinerated to scale it off.

Figure 32C:
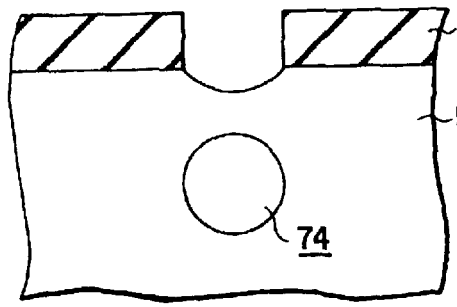
Figure 33C:
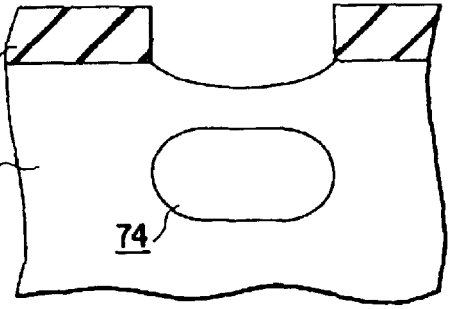

Next, as shown in FIG. 32C and FIG. 33C, a high-temperature annealing is performed in a deoxidizing atmosphere under reduced pressure such as, e.g., in a 100% hydrogen atmosphere at 10 Torr and at 1000° C., whereby the open portion of the groove 73 is closed to form a cavity 74 in the silicon substrate 51.

Figure 32D:
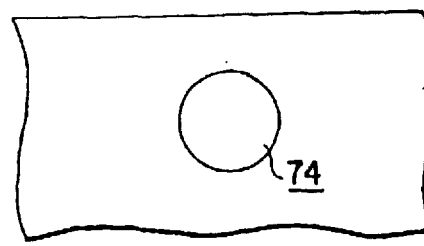
Figure 33D:
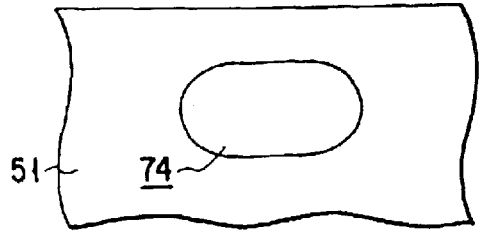

Next, as shown FIG. 32D and FIG. 33D, the oxide film 71 is removed by the use of a dilute HF solution, and then, a high-temperature annealing is carried out again in a deoxidizing atmosphere under reduced pressure such as, e.g., in a 100% hydrogen atmosphere at 10 Torr and at 1000° C., whereby the surface of the silicon substrate 51 is flattened.

Figure 32E:
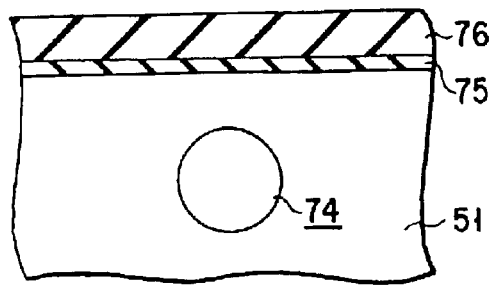
Figure 33E:
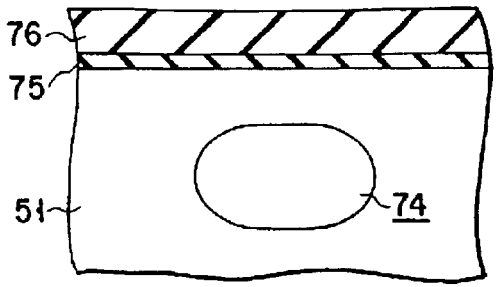

Next, as shown in FIG. 32E and FIG. 33E, the surface of the silicon substrate 51 is thermally oxidized to form a thermal oxide film 75, and then, by the use of the CVD method, a silicon nitride film 76 is formed on the thermal oxide film 75.

Figure 32F:
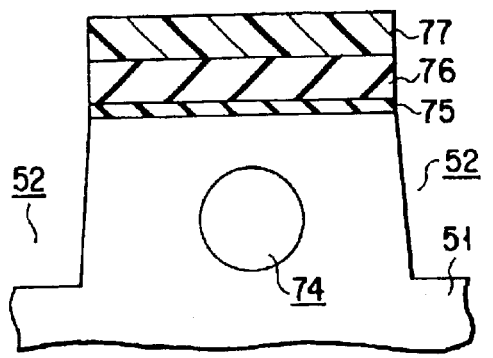
Figure 33F:
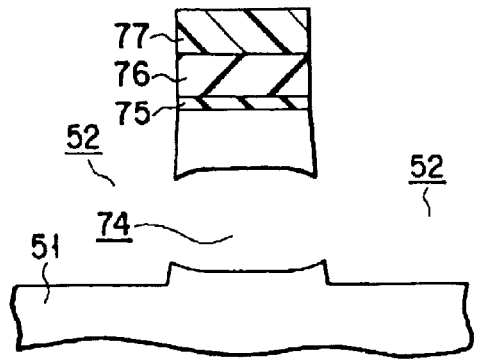

Next, as shown in FIG. 32F and FIG. 33F, a photoresist pattern 77 is formed on the silicon nitride film 76, and then, by the use of this photoresist pattern 77 as a mask, the silicon nitride film 76, the thermal oxide film 75, the silicon substrate 51 are anisotropically etched, whereby the groove 52 is formed. In this case, the ends, in the channel width direction, of the cavity 74 formed in the silicon substrate 51 are connected to the groove 52. After this, the photoresist pattern 77 is incinerated to scale it off.

Figure 32G:
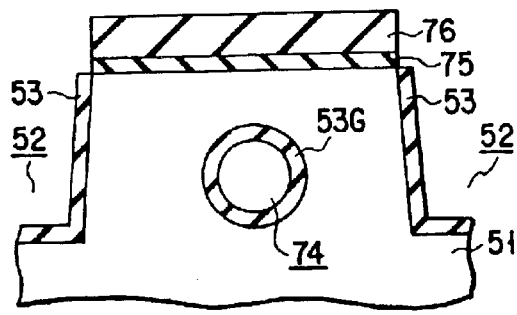
Figure 33G:
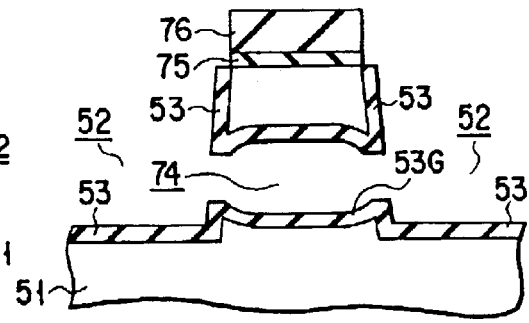

Next, as shown in FIG. 32G and FIG. 33G, the surface of the groove 52 is oxidized in an HCl/O$_2$ atmosphere at 950° C. to form the thermal oxide film 53. In this case, the inner surface of the cavity 74 is also oxidized, so that the second gate insulation film 53$_G$ is formed on the inner surface of the cavity 74.

Figure 32H:
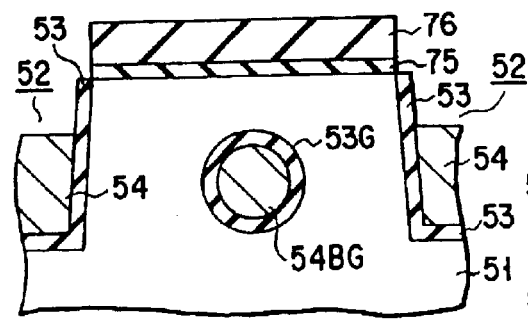
Figure 33H:
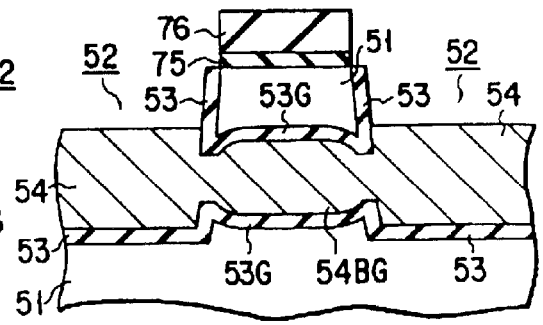

Next, as shown in FIG. 32H and FIG. 33H, by the use of the LPCVD method, a polycrystalline silicon film with an impurity added thereinto for constitution of the back gate electrode 54$_{BG}$ and the polycrystalline silicon film 54 is deposited over the whole surface so as to fill up the interior of the cavity 74 and the groove 52. After this, the polycrystalline silicon film portion unnecessary for the constitution of the back gate electrode 54$_{BG}$ and the polycrystalline silicon film 54 is removed. The removal of this polycrystalline silicon film is performed by, e.g., an etch back method comprising a combination of the CMP and the anisotropic etching method.

Figure 32I:
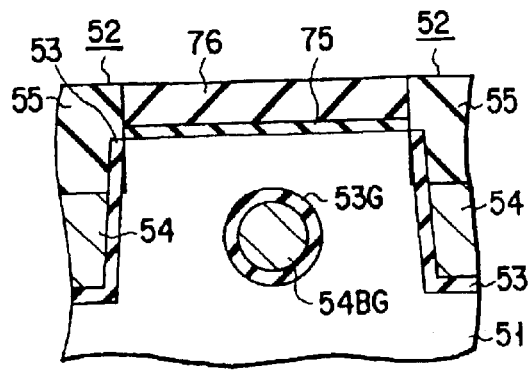
Figure 33I:
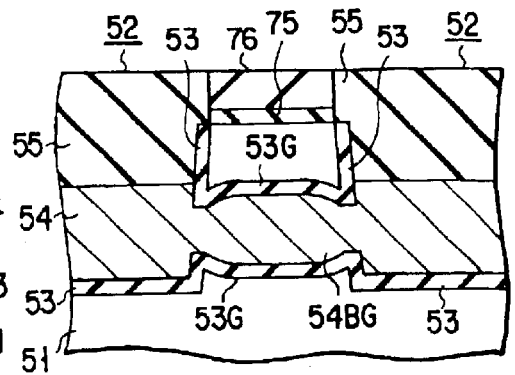

Next, as shown in FIG. 32I and FIG. 33I, a silicon oxide film 55 is deposited over the whole surface by the use of the CVD method. After this, the silicon oxide film 55 is polished by the use of the CMP method until the surface of the silicon nitride film 76 comes to be exposed, whereby the interior of the groove 52 is filled up with the silicon oxide film 55.

Figure 32J:
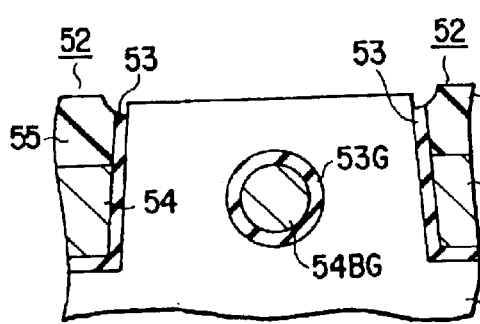
Figure 33J:
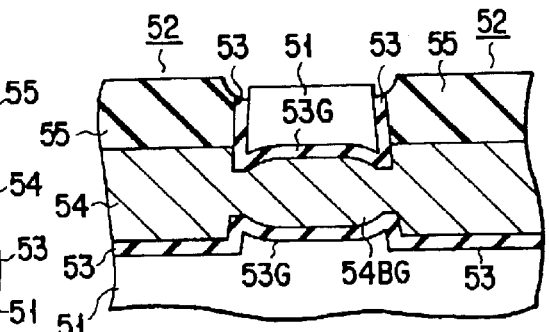

Next, by the use of a heated H$_3$PO$_3$ solution, the silicon nitride film 76 is removed as shown in FIG. 32J and FIG. 33J. In this case, the portions of the silicon oxide film 55 and the thermal oxide film 53 which lie on the groove 52 are somewhat removed, and thus, the surface portion of the silicon substrate 51 which lies in the upper edge portion of the groove 52 is exposed.

Figure 32K:
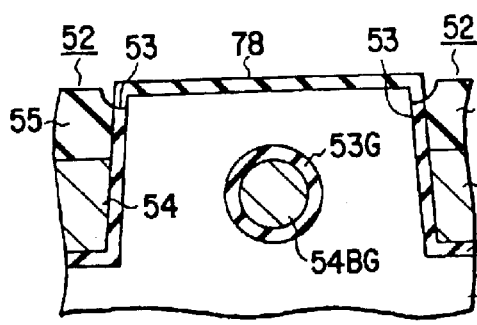
Figure 33K:
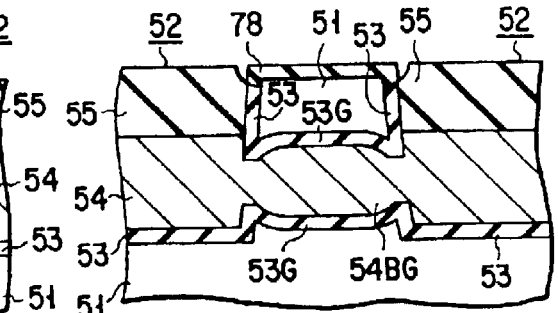

Next, as shown FIG. 32K and FIG. 33K, by oxidizing the surface of the exposed surface portion of the silicon substrate 51, a thermal oxide film 78 with a thickness of, e.g., 10 nm is formed. After this, in order to adjust the threshold voltage, a necessary p-type or n-type impurity is ion-implanted into the silicon substrate 51 through the thermal oxide film 78 as required.

Figure 32L:
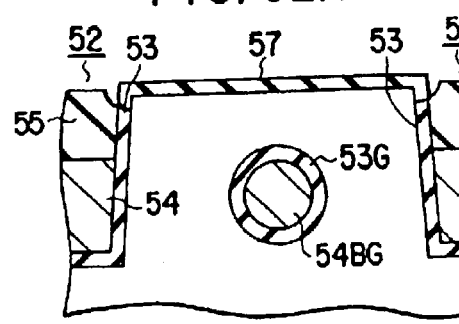
Figure 33L:
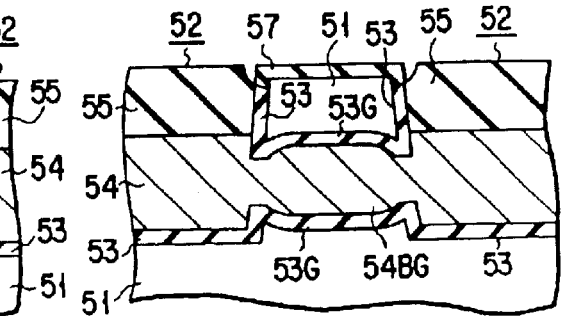

Next, as shown in FIG. 32L and FIG. 33L, the thermal oxide film 78 is removed by the use of a dilute HF solution, and then, the exposed substrate surface portion is thermally oxidized in, e.g., an Hcl/O$_2$ atmosphere at 900° C. to form a first gate insulation film 57.

In this case, the first gate insulation film 57 is formed not only on the MOS transistor forming region but also on the upper edge portion of the groove 52, so that the no exposed silicon surface is left.

Figure 32M:
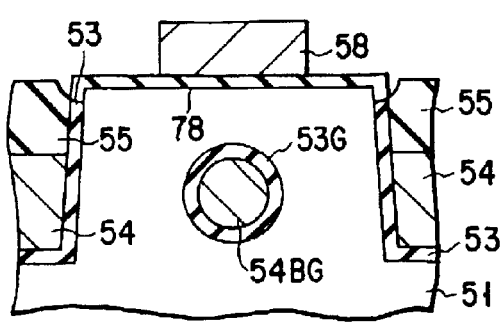
Figure 33M:
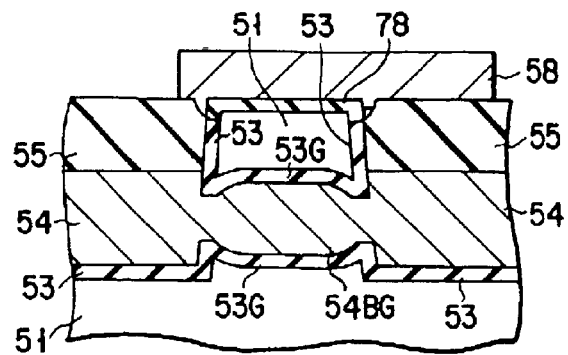
Figure 32N:
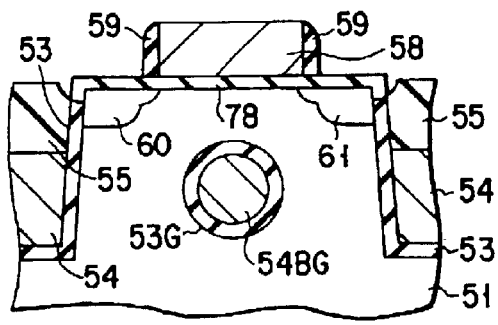
Figure 33N:
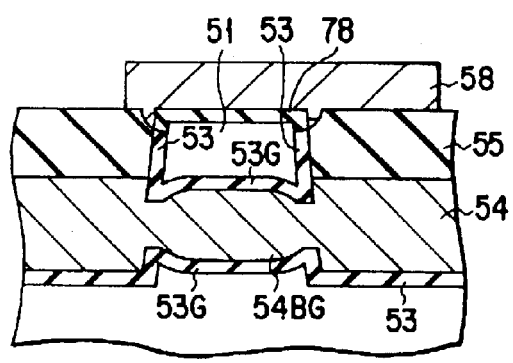

The process to be taken after this is the same as the known transistor forming process: First, as shown in FIG. 32M and FIG. 33M, a polycrystalline silicon film which will constitute the gate electrode 58 is formed over the whole surface, and then, this polycrystalline silicon film is patterned to form the gate electrode 58.

Here, as the structure of the gate electrode 58, the polycrystalline silicon gate structure is adopted, but other structures such as the poly-metal gate structure comprising a laminated film consisting of a polycrystalline silicon film and a metal film, the metal gate structure, etc. can alternatively be adopted.

Next, as shown in FIG. 32N and FIG. 33N, the gate side wall insulating film 59 and the diffused source layer 60 and the diffused drain layer 62 which are both of the LDD structure are formed.

Finally, the inter-layer insulation film 62 is deposited on the whole surface; by the use of the lithography and the anisotropic etching method, the connection holes 67 to 70 are bored in the inter-layer insulation film 62, and then, wirings 63 to 66 are formed, with which the MOS transistor shown in FIG. 31A to FIG. 31C is completed.

(Eighth Embodiment)

Through this embodiment, an improvement in the method of forming the cavities in the MOS transistors so far described above will be described. In order to form a cavity in the silicon substrate, heat treatment at high temperature must be performed over a long time. Further, if the aspect ratio of the groove which will constitute the cavity is so small as on the order of 3, then the substrate surface can be flattened by the heat treatment, but the formation of a cavity is difficult.

The cavity forming method according to this embodiment has all the above-mentioned inconveniences eliminated, which will be described below. The cavity forming method according to this embodiment can be applied to any of the MOS transistors according to the first to 7th embodiments.

Figure 34A:
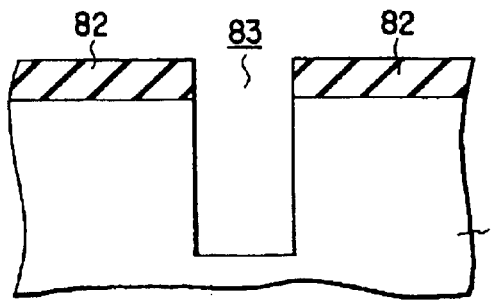
FIGS. 34A to 34C are sectional views showing steps of method of forming the MOS transistor according to an eighth embodiment of the present invention.

First, as shown in FIG. 34A, a mask pattern 82 is formed on a silicon substrate 81, and then, the silicon substrate 81 is patterned by an anisotropic etching method such as, e.g., RIE using the thus formed mask pattern 82 as a mask, whereby a groove 83 is formed.

The mask pattern 82 is formed, for example, by patterning a silicon oxide film by the use of a photoresist. Further, as for the size of the groove 83, the diameter of the open portion thereof is 0.4 μm, and the depth thereof is 1.2 μm.

Figure 34B:
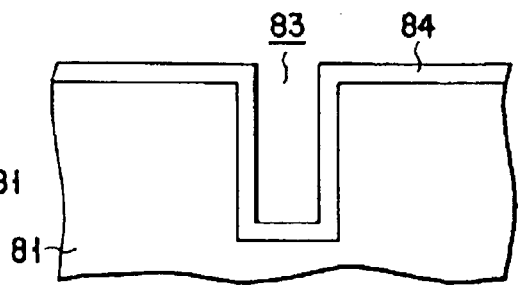

Next, as shown in FIG. 34B, the mask pattern 82 is removed, and the natural oxide film on the surface of the silicon substrate 81 is removed, and then, an epitaxial SiGe film 84 with a thickness of 50 m and a Ge content of 15% is formed over the whole surface by the use of the epitaxial growth method. As a result, the inner surface of the groove 83 turns out to be formed of SiGe.

Figure 34C:
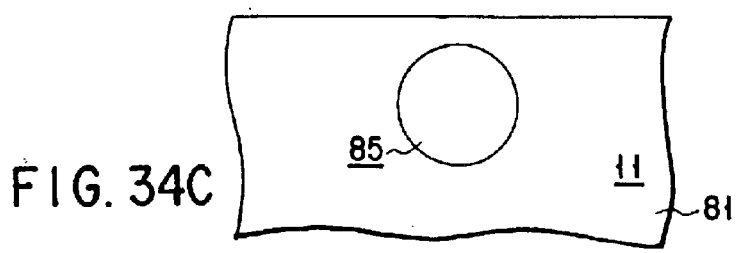

Finally, as shown in FIG. 34C, a heat treatment is carried out in a 100% hydrogen atmosphere at 1000° C. and at 10 Torr for 10 minutes, whereby a cavity 85 is formed in the silicon substrate 81. In this case, Ge in the epitaxial SiGe film 84 diffuses into the silicon substrate 81, and thus, the epitaxial SiGe film 84 ceases to exist. Here, a heat treatment at 1100° C. is carried out, but the heat treatment can alternatively be carried out at 950° C. That is, even if the heat treatment is performed at a temperature lower than in the case of a pure silicon substrate containing no Ge, the cavity 85 can be formed.

Further, the present inventors tried to form the cavity 85 by the same method as the above-mentioned method except for the point that the epitaxial SiGe film 84 be not formed, but the cavity 85 could not be formed though the surface the silicon substrate 51 was flattened.

From the results mentioned above, it has become clear that, in case, by subjecting the silicon substrate 81 having the groove 83 with the same aspect ratio to a heat treatment with the same condition, the epitaxial SiGe film 84 is deposited on the silicon substrate 81, the cavity 85 can be formed, whereas, in case the epitaxial SiGe film 84 is not deposited on the silicon substrate 81, the cavity 85 cannot be formed.

In case the inner surface of the groove 83 is formed of SiGe having a lower melting point than that of silicon, even if the groove 83 of a shape with an aspect ratio of 3 is formed in the silicon substrate 81, the cavity 85 can be formed in the silicon substrate 81; it is considered that this is because migration is caused in the surface of the surrounding wall of the groove 83 at a lower temperature.

Figure 35A:
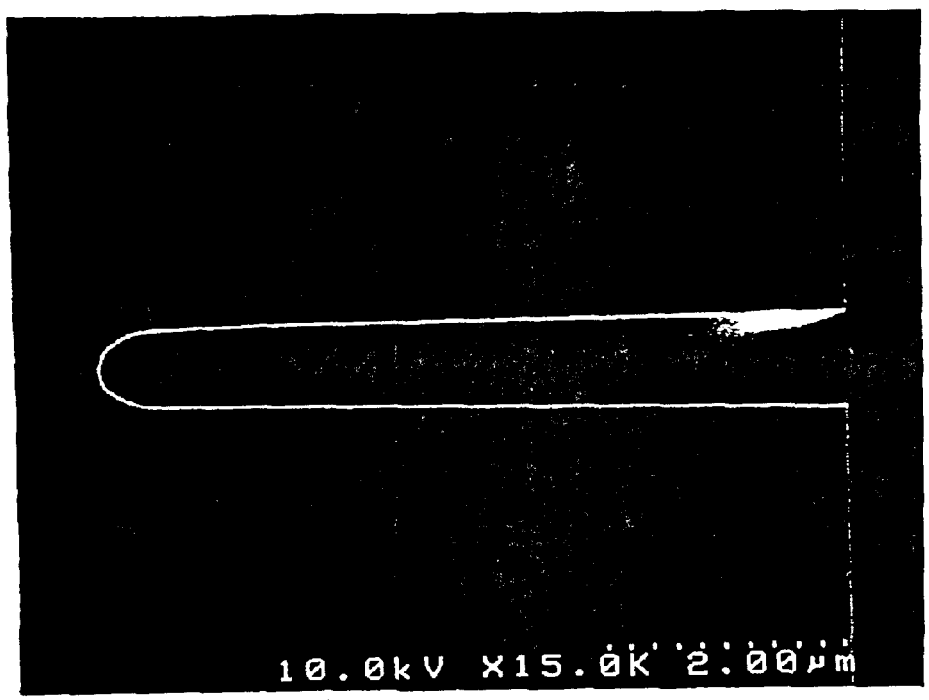
FIGS. 35A and 35B are microscopic photographs showing the shape, before and after the heat treatment, of the trench on the inner wall of which no epitaxial SiGe film is formed
Figure 35B:
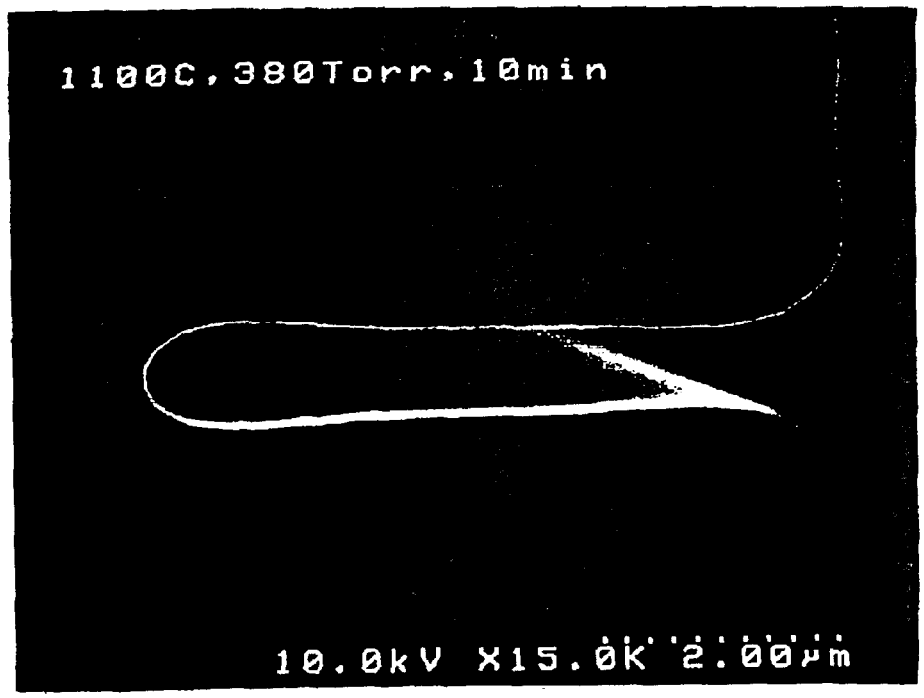
Figure 36A:
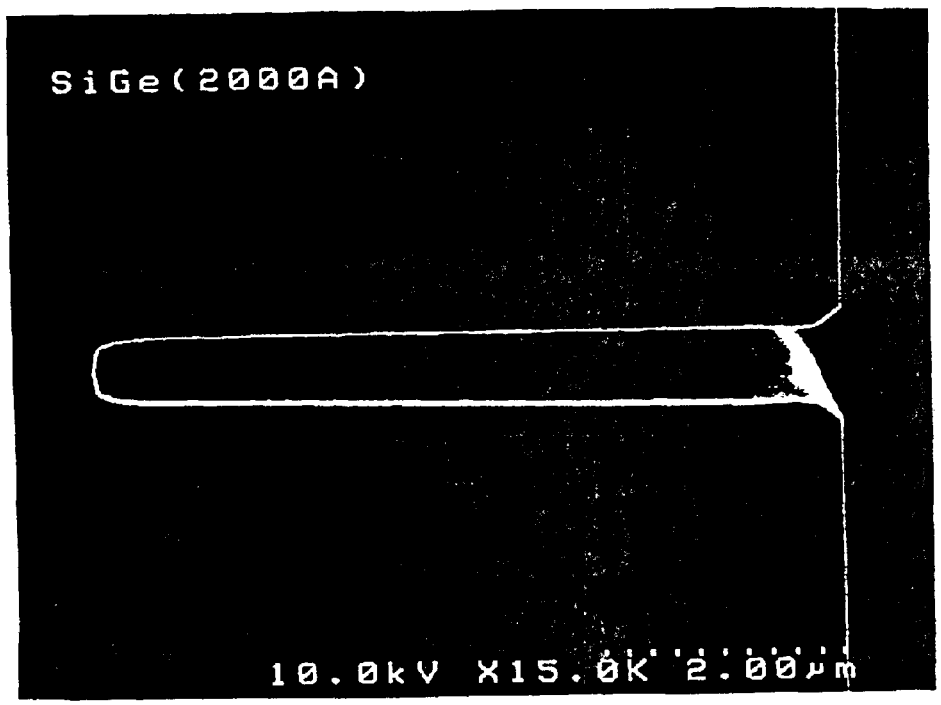
FIGS. 36A and 36B are microscopic photographs showing the shape, before and after the heat treatment, of the trench on the inner wall of which the epitaxial SiGe is formed.
Figure 36B:
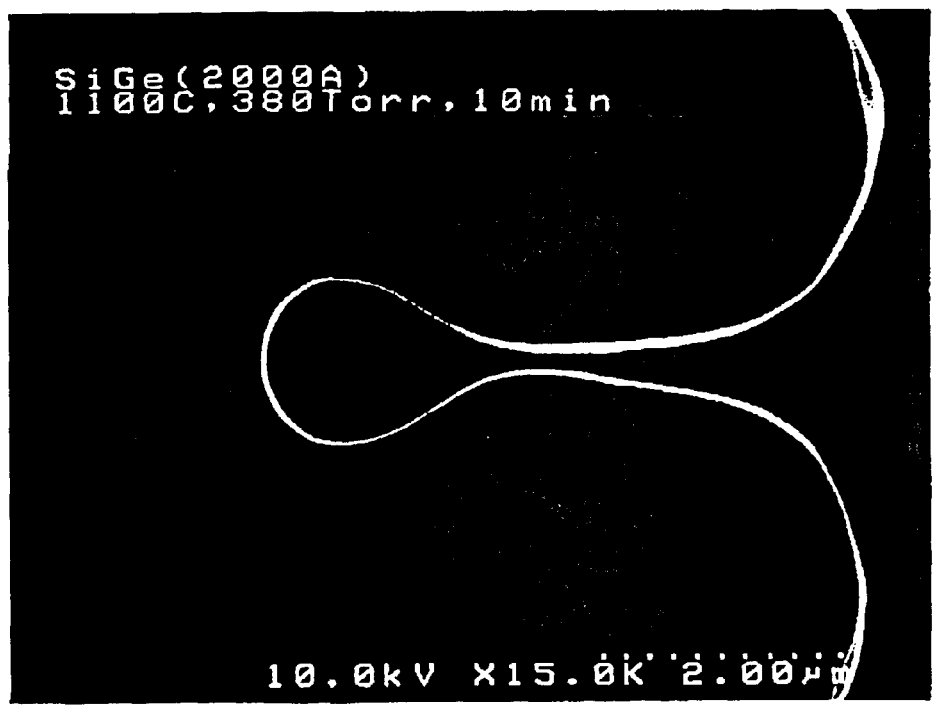

FIGS. 35A AND 35B show microscopic photographs, taken before and after the heat treatment is carried out, of a trench on the inner wall of which no epitaxial SiGe film is formed. Further, FIGS. 36A AND 36B show microscopic photographs, taken before and after the heat treatment is carried out, of a trench on the inner wall of which an epitaxial SiGe film is formed. FIGS. 35A and 36A show the state of the trench before the heat treatment, and FIGS. 35B and 36B show the state of the trench after the heat treatment. The thickness of the epitaxial SiGe film is 200 nm, the heat-treating temperature is 1100° C., the pressure applied is 380 Torr, and the duration of the heat treatment is ten minutes. From these figures, it is understood that, in case the epitaxial SiGe film is formed on the inner wall of the trench, the shape of the trench is largely deformed due to the heat treatment.

Figure 37:
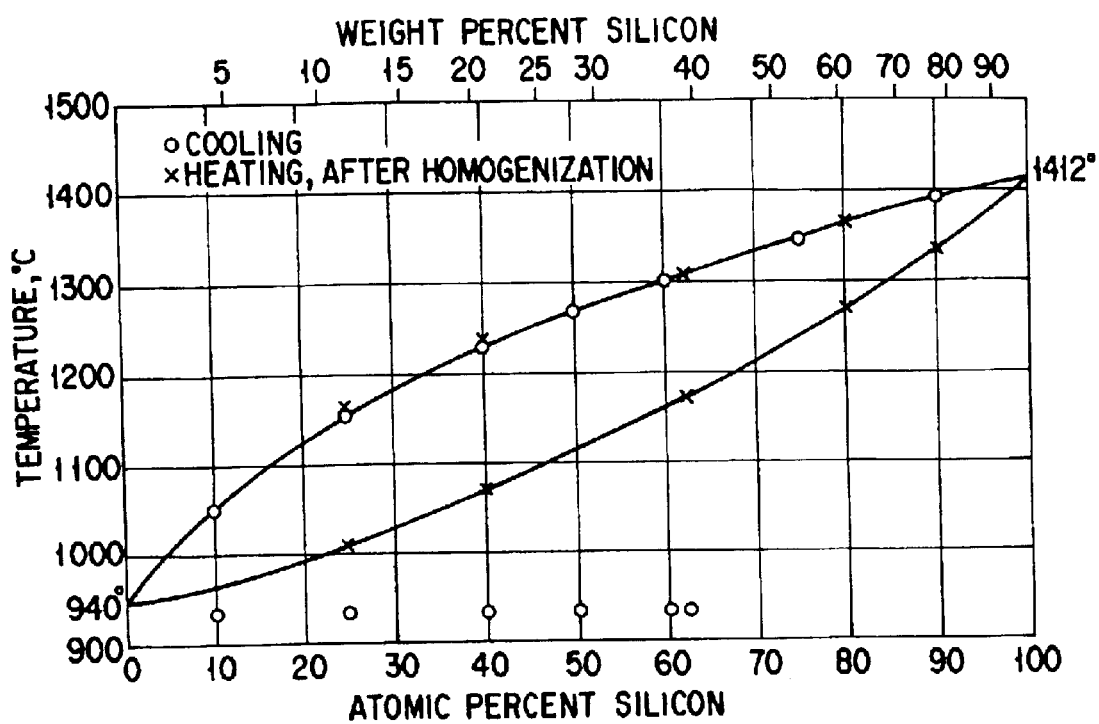
FIG. 37 is a graph showing the dependence on the Si atom concentration of the melting point of SiGe

FIG. 37 shows the dependence on the Si atom concentration of the melting point of SiGe. From FIG. 37, it is understood that the melting point of SiGe lies between the melting point of Si and the melting of Ge, and that the melting point of SiGe lowers as the content of Ge increases.

Thus, it follows that, even if, in place of the epitaxial SiGe film 84 with a Ge content of 15%, an epitaxial SiGe film or an epitaxial Ge film which has a higher Ge content is used, the same effect as that which is obtained by the use of the epitaxial SiGe film 84.

However, in order to form the cavity by surely deforming the groove, the content of Ge should desirably be 40% or less. In order to form a cavity with a smooth inner surface by deforming the groove, the Ge content should desirably be 20% or less and, more desirably, 10% or less.

As has been described above, according to this embodiment, the epitaxial SiGe film 84 with a low melting point is utilized, whereby the groove 83 can be deformed at a lower temperature and in a shorter time, and thus, the cavity 85 can be easily formed. Further, even if the groove 83 with a small aspect ratio of 3 is used, the cavity 85 can be formed in the silicon substrate 81. Further, the present inventors have confirmed that, even if a groove with a small aspect ratio of 1 is used, a cavity can be formed in the silicon substrate.

(Ninth Embodiment)

According to this embodiment, too, the above-described method of forming the cavity for the MOS transistor is improved.

The substrate surface portion lying above the cavity needs to be flat since it is the region in which the element is to be formed. As one method of flattening the element region lying above the cavity, it is considered to heat-treat the silicon substrate in a high-temperature deoxidizing atmosphere after the formation of the cavity.

However, in the case of this method, there is the fear that the deformation, reduction in size, or disappearance of the cavity may take place depending on the heat treatment condition, as a result of which the effects such as the "short channel effect" suppressing effect due to the existence of the cavity may not be obtained any more.

The cavity forming method according to this embodiment has the above-described inconveniences eliminated and can be applied to any of the MOS transistors according to the foregoing first to seventh embodiments. The cavity forming method according to this embodiment will now be described.

Figure 38A:
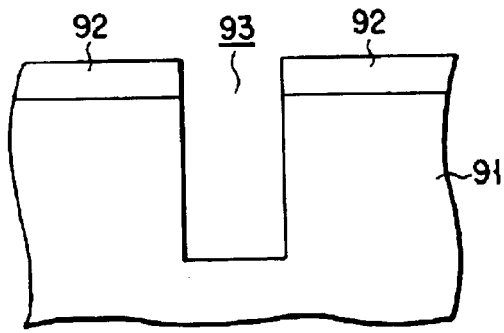
FIGS. 38A to 38D are sectional views showing the method of forming the cavity of the MOS transistor according to a ninth embodiment of the present invention.

First, as shown in FIG. 38A, a mask pattern 92 is formed on a silicon substrate 91 as in the case of the eighth embodiment, and then, an anisotropic etching is carried out by the use of this mask pattern 92 as a mask to pattern the silicon substrate 91, whereby a groove 93 is formed.

Figure 38C:
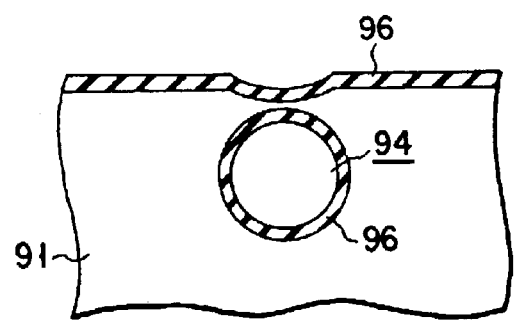
Figure 38B:
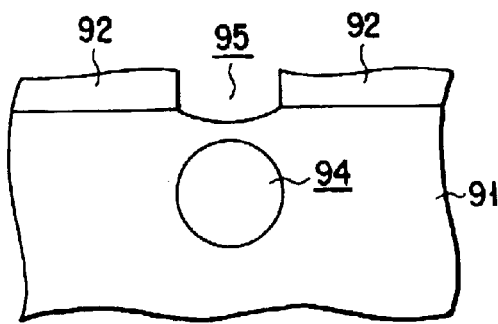

Next, as shown in FIG. 38B, heat treatment is performed for 10 minutes in a deoxidizing atmosphere under reduced pressure such as, e.g., in a 100% hydrogen atmosphere at 1100° C. and at 10 Torr, whereby the open portion of the groove 93 is closed to form a cavity 94. In this case, a depression 95 is produced in the surface portion of the silicon substrate 91 which lies above the cavity 94, and thus, the surface ceases to be flat. After this, the mask pattern 92 is removed by the use of, e.g., an aqueous hydrofluoric acid solution.

Next, as shown in FIG. 38C, an oxidizing treatment is performed for one hour, for example, in a dry oxygen atmosphere at 1100° C., whereby a silicon oxide film 96 is formed on the surface of the silicon substrate 91 and on the inner surface of the cavity 94. The silicon oxide film 96 formed on the inner surface of the cavity 94 plays the role of preventing the cavity 94 from being deformed and reduced in size and disappearing at the subsequent heating steps.

Figure 38D:
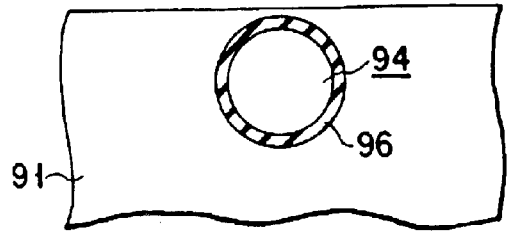

Finally, as shown in FIG. 38D, the silicon oxide film 96 on the surface of the silicon substrate 9 is removed by the use of an aqueous hydrofluoric acid solution, and then, a high-temperature heat treatment is performed in a deoxidizing atmosphere to erase the depression 95 produced when the cavity 94 was formed, whereby the substrate surface is flattened. In this case, the cavity 94 is neither deformed nor reduced in size nor disappears.

As has been described above, according to this embodiment, the silicon oxide film 96 is formed on the inner surface of the cavity 94 before performing the heat treatment for erasing the depression 95 produced when the cavity 94 was formed, whereby the substrate surface can be flattened without bringing about the deformation, reduction in size or disappearance of the cavity 94.

(Tenth Embodiment)

FIGS. 39A to 39D are sectional views showing the respective steps of the method for the manufacture of the MOS transistor according to a tenth embodiment of the present invention. In these figures, the portions corresponding to these shown in FIGS. 34A to 34C are referenced by the same reference numerals.

Figure 39A:
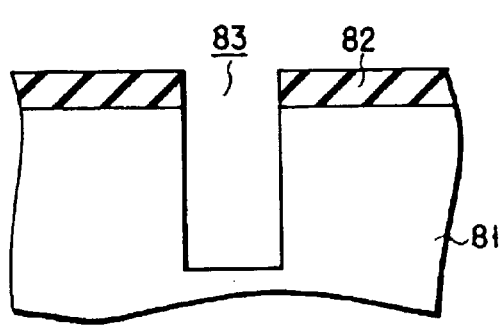
FIGS. 39A to 39D are sectional views showing the respective steps of the method for formation of the cavity in the MOS transistor according to the tenth embodiment of the present invention.

First, as shown in FIG. 39A, a mask pattern 82 is formed on a silicon substrate 81, and then the silicon substrate 81 is patterned by performing anisotropic etching by the use as a mask of a mask pattern 82 as in the case of the ninth embodiment to thereby form a grove 83, which has a diameter (in the open portion) of 0.4 μm and a depth of 1.2 μm.

Figure 39B:
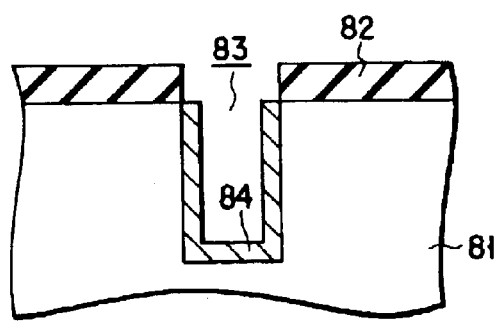

Next, as shown in FIG. 39B, the natural oxide film (not shown) formed on the inner surface of the groove 83 is removed, and then, by the use of the epitaxial growth method, an epitaxial SiGe film 84 is selectively formed on the inner surface of the groove 83. After this, the mask pattern 82 is removed.

Figure 39C:
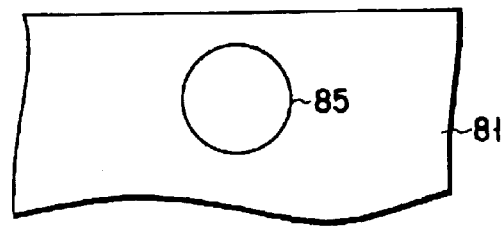

Finally, as shown in FIG. 39C, a high-temperature heat treatment is carried out in a 100% hydrogen atmosphere at 1000° C. and under 10 Torr for ten minutes, whereby a cavity 85 is formed.

As has been stated above, according to this embodiment, the epitaxial growth of SiGe is carried out in the state in which the surface of the substrate portion other than the portion in which the groove 85 is formed is covered with the mask pattern 82, whereby it is ensured that the cavity 85 can be formed in the silicon substrate 81 without losing the flatness of the upper surface of the silicon substrate 81.

Figure 39D:
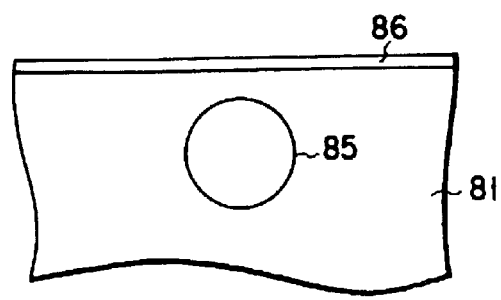

Further, it is added that, after the step shown in FIG. 39C, an epitaxial Si film 86 may also be formed on the surface of the substrate as shown in FIG. 39D This epitaxial Si film 86 contains substantially no Ge. Therefore, if a transistor is formed by the use of the epitaxial film 86, then there is no need of taking into consideration the influence of Ge on the channel interface, so that the designing of transistors becomes easy.

Next, the flow phenomenon of the SiGe film 84 will be described by reference to FIGS. 40A to 40C.

Figure 40A:
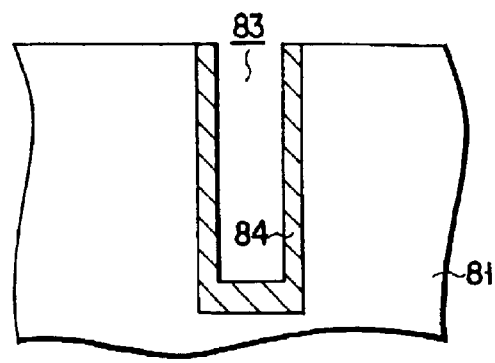
FIGS. 40A to 40C are a schematic diagram for explaining the flow phenomenon of the SiGe film formed on the inner wall of the trench.

First, as shown in FIG. 40A, the SiGe film 84 is selectively formed on the inner surface of the groove 83. The diameter of the groove 85 is 1.6 μm, and the depth thereof is 6 μm. The Ge content of the SiGe film 84 is 15%, and the thickness thereof is 100 nm.

Next, heat treatment was carried out in a 100% hydrogen atmosphere at 1100° C. and under 1 Torr. As a result, the SiGe film 84 which has a lower melting point flew, as shown in FIG. 40B, before the silicon substrate 81 did, as a result of which the shape of the groove 93 was largely changed.

Figure 40B:
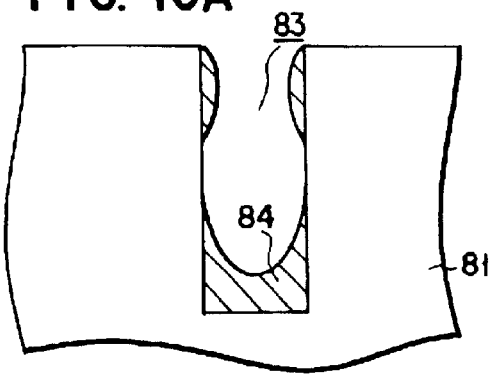
Figure 40C:
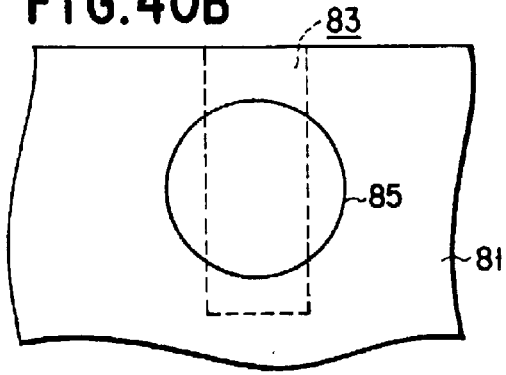

Therefore, by the driving force caused when the portion of the silicon substrate 81 which lies below the groove 83 tends to change its shape into a shape with a small surface energy (ball shape in this case), the portions of the silicon substrate 81 and the SiGe film 84 which lie in the side surface and the bottom surface of the groove 83 are largely deformed, as a result of which a cavity 85 as shown in FIG. 40C is formed in the silicon substrate film 81.

In FIG. 40C, the original groove 8 with a diameter of 1.6 μm is shown by a dotted line. From FIG. 40C, it is understood that, when the cavity is formed, the silicon also largely flows.

Figure 41:
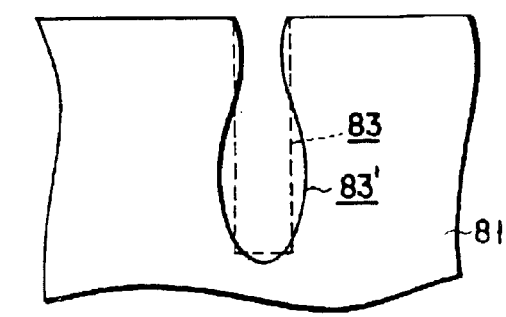
FIG. 41 is a sectional view showing the shape of the trench in case heat treatment is performed with no SiGe film formed.

FIG. 41 is sectional views showing the shape of the groove after the silicon substrate 81 which has a groove formed without forming a SiGe film is subjected to heat treatment. Reference to FIG. 41, the reference numeral 83 denotes the groove before heat treatment is carried out, reference symbol 83a denotes the groove after the heat treatment. The size and the heat treatment condition of the groove 83 are the sane as in the case shown in FIG. 38A to 38D.

From this figure, it is understood that the groove is deformed by performing heat treatment under the same condition, but no cavity is formed. This is considered to be caused, even if heat treatment is performed under the same condition, the easiness in flowing of the silicon varies in accordance with the difference in shape of the groove.

In case of FIGS. 40A to 40C, the shape of the groove 83 largely changes due to the flow of the SiGe film 84, but, in case of FIG. 41, the shape of the groove 83 is changed very little since the SiGe film 84 is not provided. If the change in shape of the groove is large, then the driving force caused when the silicon substrate tends to be deformed also becomes large; and thus, the silicon becomes apt to flow.

Therefore, it is considered that, in case of FIG. 40A to 40C, a large driving force is obtained, whereby a cavity can be formed, while, in case of FIG. 41, only a small driving force is obtained, so that no cavity can be formed. From the above-mentioned facts, it is considered desirable, in order to facilitate the formation of the cavity, to increase the thickness of the SiGe film and largely deform the groove.

Next, the result obtained by examining in detail, by the use of an atomic force microscope (AFM), the cavity formed in the silicon substrate, will be described.

In this case, after the groove was formed in the silicon substrate, a cavity was formed by subjecting the whole to heat treatment in a hydrogen atmosphere at 1100° C. and under 10 Torr for ten minutes. By carrying out heat treatment in a deoxidizing atmosphere at high temperature as mentioned above, the natural oxide film on the surface of the silicon substrate is removed to expose the silicon; then, the silicon atoms diffuse in the surface of the silicon substrate so that the surface energy of the silicon substrate may become the minimum. As a result, a cavity is formed in the silicon substrate.

Figure 42:
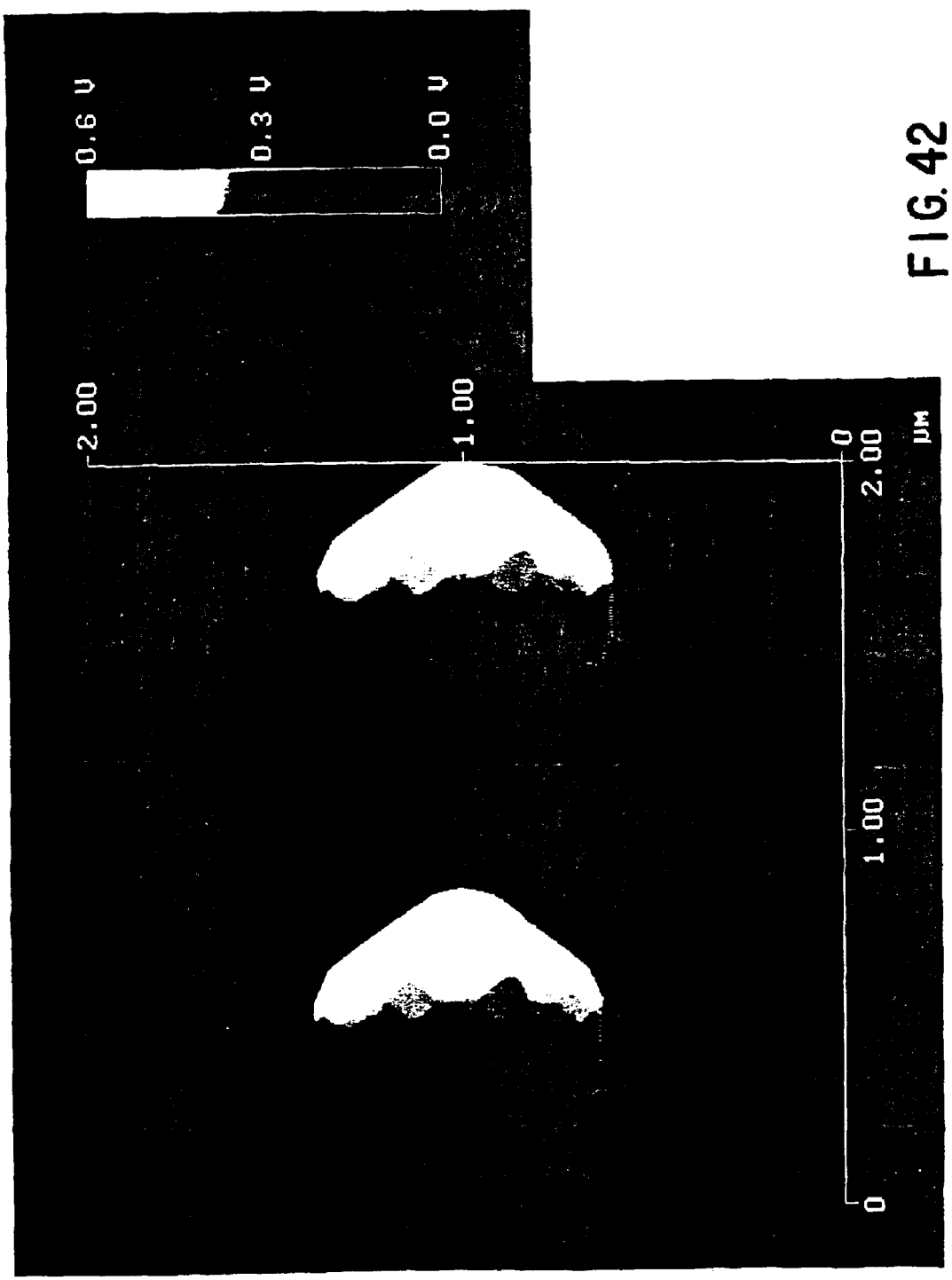
FIG. 42 is a microscopic photograph showing the inner wall of the cavity as observed by the use of an atomic force microscope.

FIG. 42 is a microscopic photograph showing the result of the analysis made of the thus formed cavity by the use of an AFM. From this figure, it is understood that the inner wall of the cavity is constituted of a polyhedron. Further, the angle made by the plane orientation of the surface constituting the polyhedron with respect to the (100) plane which constitutes the main surface of the silicon substrate was examined, as a result of which the following has been found: That is, the surface constituting the polyhedron is constituted of a (100) plane group, a {110} plane group, a {111} plane group, a {311} plane group, a {531} plane group, and a {541} plane group. Since these plane groups have a low surface energy, it can be considered that the above-mentioned cavity is thermally stable. Further, in case the above-mentioned cavity is utilized for a back gate structure as according to the seventh embodiment, the interfacial level between the back gate electrode $54_{EG}$ and the gate insulating film $53_G$ is decreased, and thus, excellent electric characteristics can be obtained.

The present invention is not limited only to the foregoing embodiments. In the above-described embodiments, the present invention is applied to the case of forming MOS transistors, but the invention is not limited to such application, but can be applied to other types of field-effect transistors such as, e.g., MESET etc. Further, the present invention can be applied even to a MOS transistor of the double gate structure (for example, floating gate/control gate).

Further, in the case of the foregoing embodiments, a region (cavity) filled up with air and a region filled up with an insulation film (solid body) are formed beneath the MOS transistor forming region, whereby the spread of the depletion layers from the source and drain are stopped to thereby suppress the short channel effect, but it is alternatively possible to arrange the element in such a manner that a region filled with a liquid is formed beneath the MOS transistor forming region to thereby suppress the short channel effect.

Further, it is also possible to stop the spread the depletion layers by forming a semiconductor layer composed of a semiconductor material which has a larger band gap than that of the material constituting the semiconductor substrate, in place of forming a cavity and an insulation film.

In this case, for example a groove is formed in the substrate surface, and, in the bottom portion of this groove, the above-mentioned semiconductor layer with a large band gap is formed, and, on the semiconductor layer thus made, a semiconductor layer composed of the constituent substance of the semiconductor substrate is formed to fill up the groove. Further, the semiconductor material used is selected by taking into consideration specifications such as the element size, the supply voltage, etc.

Further, the MOS transistors according to the foregoing embodiments are used in, e.g., the memory cells of DRAM. Further, in case the present invention is applied to MOS transistors of the double gate structure, the MOS transistors are used in, e.g., the memory cells of EEPROM.

Further, the channel type of the MOS transistors according to the foregoing embodiments may either be the n-channel or the p-channel. In case of the n-channel, an n-type impurity such as, e.g., As is ion-implanted into the silicon substrate to form an n-type diffused source layer and an n-type diffused drain layer. In case the gate electrode is comprised of a polycrystalline silicon film, an n-type impurity is introduced also into the polycrystalline silicon film.

Further, the MOS transistors according to the foregoing embodiments may each alternatively be formed in a well layer formed in the surface of the silicon substrate. In case of CMOS for example, at least one of the n-channel and the p-channel MOS transistors is formed in a well layer.

Further, the substrate may alternatively be a different type of substrate other than the silicon substrate. For example, a SiGe substrate can also be used. Further, in case of producing a partial depletion MOS transistor, the substrate can be a SOI substrate. In this case, however, such inconveniences are encountered as the rise in manufacturing costs due to the use of the SOI substrate.

Also, various other changes and modifications can be made without departing from the sprit and scope of the invention.

As has been described above, according to the present invention, the spread of the depletion layers from the source and the drain is stopped at the cavity, the semiconductor layer or the insulator, so that the spread of the depletion layers in the channel region can be prevented. As a result, even if the structural minuteness of the element is furthered, the short channel effect of the field-effect transistor can be effectively suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising the steps of:

forming a trench in the surface of a semiconductor substrate;

closing an open portion of said trench by performing heat treatment of said semiconductor substrate under reduced pressure to thereby form a cavity; and forming a field-effect transistor on a region including said cavity.

2. A method according to claim 1, wherein said heat treatment under reduced pressure is carried out in a deoxidizing atmosphere.

3. A method according to claim 2, wherein said deoxidizing atmosphere is a hydrogen atmosphere.

4. A method according to claim 1, wherein before said heat treatment, the inner surface of said trench is covered with a film composed of a semiconductor substance which has a melting point lower than that of said semiconductor substrate.

* * * * *